US012804965B2

(12) United States Patent
Agata et al.

(10) Patent No.: US 12,804,965 B2
(45) Date of Patent: Nov. 17, 2026

(54) SEMICONDUCTOR DEVICE AND METHOD FOR MANUFACTURING THE SAME

(71) Applicant: FUJI ELECTRIC CO., LTD., Kanagawa (JP)

(72) Inventors: Yasunori Agata, Matsumoto-city (JP); Takashi Yoshimura, Matsumoto-city (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 304 days.

(21) Appl. No.: 18/418,362

(22) Filed: Jan. 22, 2024

(65) Prior Publication Data

US 2024/0162287 A1 May 16, 2024

Related U.S. Application Data

(63) Continuation of application No. PCT/JP2022/024121, filed on Jun. 16, 2022.

(30) Foreign Application Priority Data

Feb. 17, 2022 (JP) ................................ 2022-022803

(51) Int. Cl.

| | |
|---|---|
| ***H10D 62/10*** | (2025.01) |
| ***H10D 8/00*** | (2025.01) |
| ***H10D 12/00*** | (2025.01) |
| ***H10D 62/13*** | (2025.01) |
| ***H10D 84/60*** | (2025.01) |

(Continued)

(52) U.S. Cl.

CPC ........... *H10D 62/112* (2025.01); *H10D 8/422* (2025.01); *H10D 12/481* (2025.01); *H10D 62/142* (2025.01); *H10D 84/617* (2025.01); *H10P 30/204* (2026.01); *H10P 30/21* (2026.01); *H10P 34/42* (2026.01)

(58) Field of Classification Search

CPC .... H10D 62/112; H10D 8/422; H10D 12/481; H10D 62/142

See application file for complete search history.

(56) References Cited

U.S. PATENT DOCUMENTS

| | | | |
|---|---|---|---|
| 2008/0050877 | A1 | 2/2008 | de Fresart |
| 2008/0164490 | A1 | 7/2008 | Rahimo |
| 2010/0025827 | A1 | 2/2010 | Fujii |

(Continued)

FOREIGN PATENT DOCUMENTS

| | | |
|---|---|---|
| CN | 101506940 A | 8/2009 |
| CN | 111418068 A | 7/2020 |

(Continued)

OTHER PUBLICATIONS

Office Action issued for counterpart German Application 112022002851.3, issued by the German Patent and Trademark Office on Jun. 27, 2025 (received on Jun. 28, 2025).

(Continued)

*Primary Examiner* — Matthew L Reames

(57) ABSTRACT

Provided is a semiconductor device comprising: a drift region of a first conductivity type which is provided in a semiconductor substrate having a front surface and a back surface; and a back surface side region of the first conductivity type or a second conductivity type which is provided on a back surface side of the semiconductor substrate relative to the drift region in the semiconductor substrate and has a higher atomic density than the drift region.

35 Claims, 17 Drawing Sheets

(51) Int. Cl.
*H10P 30/20* (2026.01)
*H10P 34/42* (2026.01)

(56) References Cited

U.S. PATENT DOCUMENTS

| | | | |
|---|---|---|---|
| 2015/0303268 | A1 | 10/2015 | Ishimaru |
| 2016/0240641 | A1 | 8/2016 | Okawara |
| 2017/0012039 | A1 | 1/2017 | Kameyama |
| 2017/0077263 | A1 | 3/2017 | Furumura |
| 2017/0092714 | A1 | 3/2017 | Horiuchi |
| 2020/0287031 | A1 | 9/2020 | Naito |
| 2021/0082702 | A1 | 3/2021 | Agata |
| 2021/0359088 | A1 | 11/2021 | Ohi |
| 2022/0149159 | A1 | 5/2022 | Kubouchi |

FOREIGN PATENT DOCUMENTS

| | | | |
|---|---|---|---|
| CN | 113454789 | A | 9/2021 |
| JP | 2004103763 | A | 4/2004 |
| JP | 2007123469 | A | 5/2007 |
| JP | 2010040562 | A | 2/2010 |
| JP | 2011243836 | A | 12/2011 |
| JP | 2012044121 | A | 3/2012 |
| JP | 2015090917 | A | 5/2015 |
| JP | 2015153788 | A | 8/2015 |
| JP | 2016004956 | A | 1/2016 |
| JP | 2017055046 | A | 3/2017 |
| JP | 2021114600 | A | 8/2021 |
| WO | 2014112228 | A1 | 7/2014 |
| WO | 2015118713 | A1 | 8/2015 |
| WO | 2020080295 | A1 | 4/2020 |
| WO | 2021166980 | A1 | 8/2021 |

OTHER PUBLICATIONS

Seino, Toshiaki et al. Development of Top-Flat Beam and Hybrid Laser Annealing System for Deep Activation of Power Semiconductor IGBTs. The Japan Steel Works Technical Review. No. 69, pp. 76-81. Nov. 1, 2018.

International Search Report and Written Opinion (ISA/237) of the International Search Authority for International Patent Application No. PCT/JP2022/024121, mailed by the Japan Patent Office on Sep. 20, 2022.

Office Action issued for counterpart Chinese Application 202280051893.5, issued by The State Intellectual Property Office of People's Republic of China on Aug. 7, 2026.

100

SEMICONDUCTOR DEVICE AND METHOD FOR MANUFACTURING THE SAME

The contents of the following patent application(s) are incorporated herein by reference:

NO. 2022-022803 filed in JP on Feb. 17, 2022

NO. PCT/JP2022/024121 filed in WO on Jun. 16, 2022

BACKGROUND

1. Technical Field

The present invention relates to a semiconductor device and a method for manufacturing the same.

2. Related Art

Patent Document 1 describes that "the n-type impurity density rises moderately from the lower surface 12b of the semiconductor substrate 12 toward a deeper side, and comes to be of a local maximum value N1". Non-Patent Document 1 describes that a BOX profile is formed on a back surface.

PRIOR ART DOCUMENT

Patent Document

Patent Document 1: Japanese Patent Application Publication No. 2015-153788

Patent Document 2: Japanese Patent Application Publication No. 2016-004956

Non-Patent Document

Non-Patent Document 1: Seino et al., "Development of Top-Flat Beam and Hybrid Laser Annealing System for Deep Activation of Power Semiconductor IGBTs", Japan Steel Works technical review, No. 69, p. 76-81 (2018.11)

It is preferable to improve an electrical property of a semiconductor device.

DESCRIPTION OF EXEMPLARY EMBODIMENTS

Figure 1A:
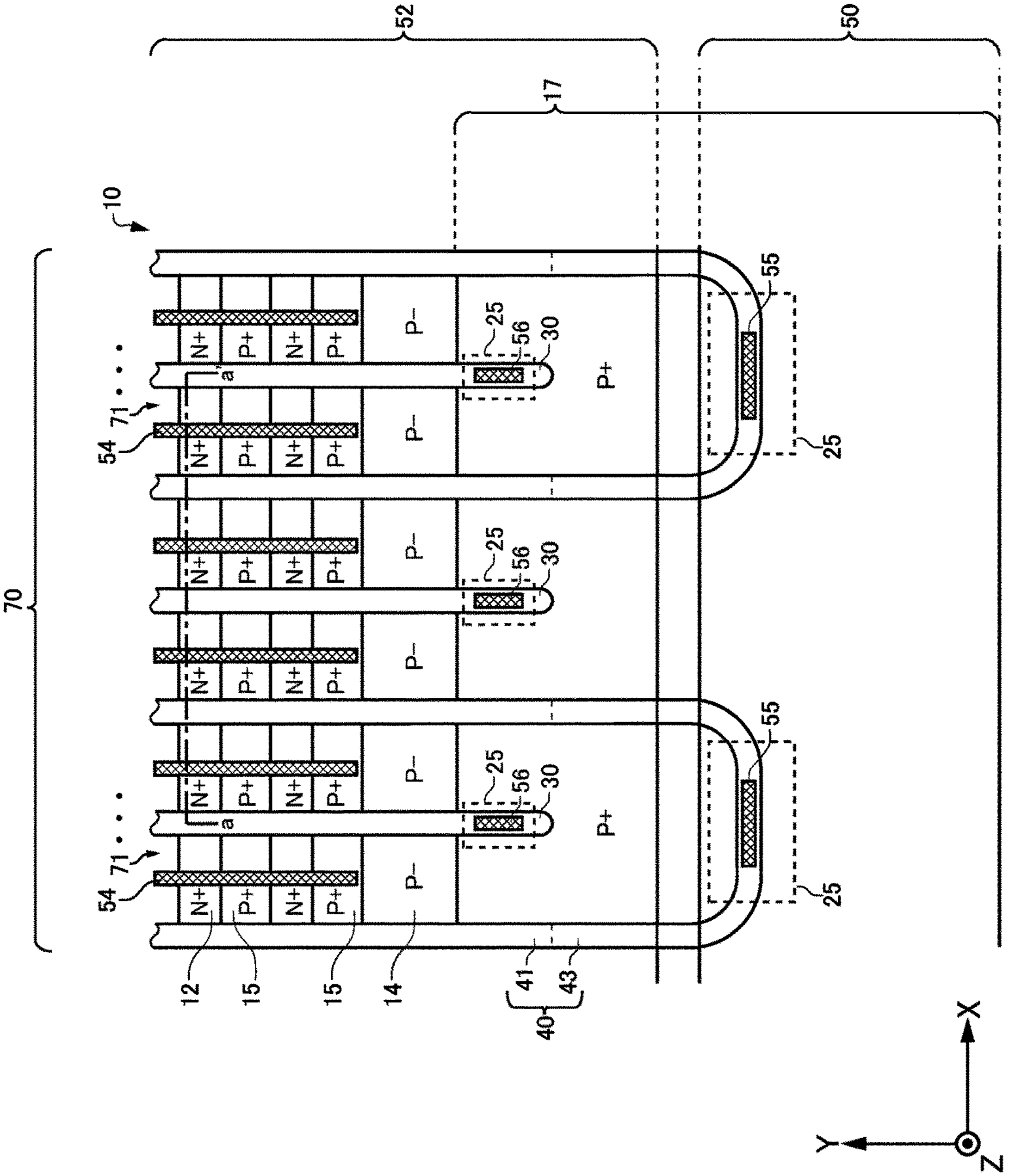
FIG. 1A shows an example of a top view of a semiconductor device 100.

Hereinafter, the present invention will be described through embodiments of the invention, but the following embodiments do not limit the invention according to claims. In addition, not all of the combinations of features described in the embodiments are essential to the solution of the invention.

In the present specification, one side in a direction parallel to a depth direction of a semiconductor substrate is referred to as "upper" and another side is referred to as "lower". One surface of two principal surfaces of a substrate, a layer or other member is referred to as an upper surface, and another surface is referred to as a lower surface. "Upper" and "lower" directions are not limited to a gravitational direction or to a direction in which a semiconductor device is mounted.

In the present specification, technical matters may be described using orthogonal coordinate axes of an X axis, a Y axis, and a Z axis. The orthogonal coordinate axes merely specify relative positions of components, and do not limit a specific direction. For example, the Z axis is not limited to indicate the height direction with respect to the ground. It should be noted that a +Z axis direction and a −Z axis direction are directions opposite to each other. When the Z axis direction is described without describing the signs, it means that the direction is parallel to the +Z axis and the −Z axis.

In the present specification, orthogonal axes parallel to the upper surface and the lower surface of the semiconductor substrate are referred to as the X axis and the Y axis. In addition, an axis perpendicular to the upper surface and the lower surface of the semiconductor substrate is referred to as the Z axis. In the present specification, the direction of the Z axis may be referred to as the depth direction. In addition, in the present specification, a direction parallel to the upper surface and the lower surface of the semiconductor substrate may be referred to as a horizontal direction, including an X axis direction and a Y axis direction.

In the present specification, a case where a term such as "same" or "equal" is mentioned may include a case where an error due to a variation in manufacturing or the like is included. The error is, for example, within 10%.

In the present specification, a conductivity type of doping region where doping has been carried out with an impurity is described as a P type or an N type. In the present specification, the impurity may particularly mean either a donor of an N type or an acceptor of the P type, and may be described as a dopant. In the present specification, doping means introducing the donor or the acceptor into the semiconductor substrate and turning it into a semiconductor presenting a conductivity type of the N type, or a semiconductor presenting conductivity type of the P type.

In the present specification, a doping concentration means a concentration of the donor or a concentration of the acceptor in a thermal equilibrium state. In the present specification, a net doping concentration means a net concentration obtained by adding the donor concentration set as a positive ion concentration to an acceptor concentration set as a negative ion concentration, taking into account of polarities of charges. As an example, when the donor concentration is $N_D$ and the acceptor concentration is $N_A$, the net doping concentration at any position is given as $N_D-N_A$. In the present specification, the net doping concentration may be simply referred to as the doping concentration.

The donor has a function of supplying electrons to a semiconductor. The acceptor has a function of receiving electrons from the semiconductor. The donor and the acceptor are not limited to impurities themselves. For example, a VOH defect in which a vacancy (V), oxygen (O), and hydrogen (H) present in the semiconductor are attached together functions as the donor which supplies electrons. In the present specification, the VOH defect may be referred to as a hydrogen donor.

In the present specification, a description of a P+ type or an N+ type means a higher doping concentration than that of the P type or the N type, and a description of a P− type or an N− type means a lower doping concentration than that of the P type or the N type. In addition, in the present specification, a description of a P++ type or an N++ type means a higher doping concentration than that of the P+ type or the N+ type.

A chemical concentration in the present specification refers to an atomic density of an impurity measured regardless of an electrical activation state. The chemical concentration can be measured by, for example, a secondary ion mass spectrometry (SIMS). The net doping concentration described above can be measured by capacitance-voltage profiling (CV method). In addition, a carrier concentration measured by spreading resistance profiling (SRP method) may be set as the net doping concentration. A carrier means an electron charge carrier or a hole charge carrier. The carrier concentration measured by the CV method or the SRP method may be a value in a thermal equilibrium state. In addition, in a region of the N type, the donor concentration is sufficiently higher than the acceptor concentration, and thus the carrier concentration in the region may be defined as the donor concentration. Similarly, in a region of the P type, the carrier concentration in the region may be defined as the acceptor concentration. In the present specification, the doping concentration in the N type region may be referred to as the donor concentration, and the doping concentration in the P type region may be referred to as the acceptor concentration.

In addition, when a concentration distribution of the donor, acceptor, or net doping has a peak in a region, a value of the peak may be defined as the concentration of the donor, acceptor, or net doping in the region. In a case where the concentration of the donor, acceptor or net doping is substantially uniform in a region, or the like, an average value of the concentration of the donor, acceptor or net doping in the region may be defined as the concentration of the donor, acceptor or net doping.

The carrier concentration measured by the SRP method may be lower than the concentration of the donor or the acceptor. In a range where a current flows when a spreading resistance is measured, carrier mobility of the semiconductor substrate may be lower than a value in a crystalline state. The reduction in the carrier mobility occurs when carriers are scattered due to disorder (disorder) of a crystal structure due to a lattice defect or the like. The carrier concentration reduces for the following reason. In the SRP method, a spreading resistance is measured, and the carrier concentration is converted from a measurement value of the spreading resistance. At this time, mobility of the crystalline state is used as the carrier mobility. On the other hand, despite the fact that the carrier mobility has reduced at a position where the lattice defect is introduced, the carrier concentration is calculated by using the carrier mobility of the crystalline state. Therefore, a value lower than an actual carrier concentration, that is, a concentration of the donor or the acceptor, is obtained.

The concentration of the donor or the acceptor calculated from the carrier concentration measured by the CV method or the SRP method may be lower than a chemical concentration of an element indicating the donor or the acceptor. As an example, in a silicon semiconductor, a donor concentration of phosphorous or arsenic serving as a donor, or an acceptor concentration of boron (boron) serving as an acceptor is about 99% of chemical concentrations of these. On the other hand, in the silicon semiconductor, a donor concentration of hydrogen serving as a donor is about 0.1% to 10% of a chemical concentration of hydrogen. In the present specification, an SI unit system is adopted. In the present specification, a unit of a distance or length may be represented by cm (centimeter). In this case, various calculations may be converted into m (meter) to be calculated. As for numeric representation of power of 10, for example, the representation 1E+16 indicates $1\times10^{16}$, and the representation 1E−16 indicates $1\times10^{-16}$.

FIG. 1A shows an example of a top view of a semiconductor device 100. The semiconductor device 100 in this example is a semiconductor chip including a transistor portion 70.

The transistor portion 70 is a region obtained by projecting a collector region 22 provided on a back surface side of a semiconductor substrate 10 onto an upper surface of the semiconductor substrate 10. The collector region 22 will be described below. The transistor portion 70 includes a transistor such as an IGBT. In this example, the transistor portion 70 is the IGBT. It should be noted that the transistor portion 70 may be another transistor such as a MOSFET.

The present figure shows a region in the neighborhood of a chip end portion which is an edge side of the semiconductor device 100, and other regions are omitted. For example, an edge termination structure portion may be provided in a region on a negative side in the Y axis direction in the semiconductor device 100 in this example. The edge termination structure portion reduces electric field strength on an upper surface side of the semiconductor substrate 10. The edge termination structure portion has, for example, a guard ring, a field plate, a RESURF, and a structure combining these. It should be noted that although this example describes an edge on the negative side in the Y axis direction for convenience, the same applies to other edges of the semiconductor device 100.

The semiconductor substrate 10 is a substrate that is formed of a semiconductor material. The semiconductor substrate 10 may be a silicon substrate, may be a silicon carbide substrate, or may be a nitride semiconductor substrate such as gallium nitride, or the like. The semiconductor substrate 10 in this example is the silicon substrate. It should be noted that, when simply referred to as a top view in the present specification, it means that the semiconductor substrate 10 is viewed from an upper surface side.

The semiconductor device 100 in this example includes, at a front surface 21 of the semiconductor substrate 10, a gate trench portion 40, a dummy trench portion 30, an emitter region 12, a base region 14, a contact region 15, and a well region 17. The front surface 21 will be described below. In addition, the semiconductor device 100 in this example includes an emitter electrode 52 and a gate metal layer 50 which are provided above the front surface 21 of the semiconductor substrate 10.

The emitter electrode 52 is provided above the gate trench portion 40, the dummy trench portion 30, the emitter region 12, the base region 14, the contact region 15, and the well region 17. In addition, the gate metal layer 50 is provided above the gate trench portion 40 and the well region 17.

The emitter electrode 52 and the gate metal layer 50 are formed of a material containing metal. At least a partial region of the emitter electrode 52 may be formed of metal such as aluminum (Al) or of a metal alloy such as an aluminum-silicon alloy (AlSi) or an aluminum-silicon-copper alloy (AlSiCu). At least a partial region of the gate metal layer 50 may be formed of metal such as aluminum (Al) or of a metal alloy such as an aluminum-silicon alloy (AlSi) or an aluminum-silicon-copper alloy (AlSiCu). The emitter electrode 52 and the gate metal layer 50 may have a barrier metal formed of titanium, a titanium compound, or the like below a region formed of aluminum or the like. The emitter electrode 52 and the gate metal layer 50 are provided separately from each other.

The emitter electrode 52 and the gate metal layer 50 are provided with an interlayer dielectric film 38 sandwiched therebetween, above the semiconductor substrate 10. The interlayer dielectric film 38 is omitted in FIG. 1A. A contact hole 54, a contact hole 55, and a contact hole 56 are provided through the interlayer dielectric film 38.

The contact hole 55 connects the gate metal layer 50 with a gate conductive portion inside the transistor portion 70. A plug metal layer formed of tungsten or the like may be formed inside the contact hole 55.

The contact hole 56 connects the emitter electrode 52 with a dummy conductive portion inside the dummy trench portion 30. A plug metal layer formed of tungsten or the like may be formed inside the contact hole 56.

A connecting part 25 is connected to a front surface side electrode such as the emitter electrode 52 or the gate metal layer 50. In an example, the connecting part 25 is provided between the gate metal layer 50 and the gate conductive portion. The connecting part 25 is also provided between the emitter electrode 52 and the dummy conductive portion. The connecting part 25 is formed of a conductive material such as polysilicon doped with an impurity. The connecting part 25 in this example is polysilicon doped with an impurity of the N type (N+). The connecting part 25 is provided above the front surface 21 of the semiconductor substrate 10 via a dielectric film such as an oxide film, or the like.

Gate trench portions 40 are examples of a plurality of trench portions extending in a predetermined extending direction on a front surface 21 side of the semiconductor substrate 10. The gate trench portions 40 are arrayed at a predetermined interval along a predetermined array direction (the X axis direction in this example). The gate trench portion 40 in this example may have two extending portions 41 which extend along an extending direction (the Y axis direction in this example) parallel to the front surface 21 of the semiconductor substrate 10 and perpendicular to the array direction, and a connecting portion 43 which connects the two extending portions 41.

At least part of the connecting portion 43 is preferably formed in a curved shape. Connecting end portions of the two extending portions 41 of the gate trench portion 40 can reduce electric field strength at the end portions of the extending portions 41. The gate metal layer 50 may be connected to the gate conductive portion at the connecting portion 43 of the gate trench portion 40.

Dummy trench portions 30 are examples of a plurality of trench portions extending in a predetermined extending direction on the front surface 21 side of the semiconductor substrate 10. The dummy trench portion 30 is a trench portion which is electrically connected to the emitter electrode 52. Similarly to the gate trench portions 40, the dummy trench portions 30 are arrayed at a predetermined interval along a predetermined array direction (the X axis direction in this example). The dummy trench portion 30 in this example has an I shape at the front surface 21 of the semiconductor substrate 10, but may have a U shape at the front surface 21 of the semiconductor substrate 10 similarly to the gate trench portion 40. That is, the dummy trench portion 30 may have two extending portions which extend along the extending direction and a connecting portion which connects the two extending portions.

The transistor portion 70 in this example has a structure in which two gate trench portions 40 and two dummy trench portions 30 are repetitively arrayed. That is, the transistor portion 70 in this example has the gate trench portions 40 and the dummy trench portions 30 at a ratio of 1:1. For example, the transistor portion 70 has one dummy trench portion 30 between two extending portions 41.

It is to be noted that the ratio between the gate trench portions 40 and the dummy trench portions 30 is not limited to that in this example. The ratio of the gate trench portions 40 may be larger than the ratio of the dummy trench portions 30, or the ratio of the dummy trench portions 30 may be larger than the ratio of the gate trench portions 40. The ratio between the gate trench portions 40 and the dummy trench portions 30 may be 2:3, or may be 2:4. In addition, the transistor portion 70 may not have the dummy trench portions 30 with all trench portions being the gate trench portions 40.

The well region 17 is a region of a second conductivity type which is provided on the front surface 21 side of the semiconductor substrate 10 relative to a drift region 18 which will be described below. The well region 17 is an example of a well region provided on the edge side of the semiconductor device 100. The well region 17 is of the P+ type as an example. The well region 17 is formed in a predetermined range from an end portion of an active region on a side where the gate metal layer 50 is provided. A diffusion depth of the well region 17 may be deeper than depths of the gate trench portion 40 and the dummy trench portion 30. Partial regions of the gate trench portion 40 and the dummy trench portion 30 on a gate metal layer 50 side are formed in the well region 17. Bottoms of ends in the extending direction of the gate trench portion 40 and the dummy trench portion 30 may be covered with the well region 17.

The contact hole 54 is formed above each of the emitter region 12 and the contact region 15 in the transistor portion 70. The contact hole 54 is not provided above well regions 17 provided at both ends in the Y axis direction. In this manner, one or more contact holes 54 are formed in the interlayer dielectric film. The one or more contact holes 54 may be provided to extend in the extending direction.

A mesa portion 71 is a mesa portion provided in direct contact with the trench portion in a plane parallel to the front surface 21 of the semiconductor substrate 10. The mesa portion may be a portion of the semiconductor substrate 10 sandwiched between two adjacent trench portions, and may be a portion from the front surface 21 of the semiconductor substrate 10 to a depth of the lowermost bottom portion of each trench portion. An extending portion of each trench portion may be defined as one trench portion. That is, the region sandwiched between two extending portions may be defined as a mesa portion.

The mesa portion 71 is provided in direct contact with at least one of the dummy trench portion 30 or the gate trench portion 40 in the transistor portion 70. The mesa portion 71 has the well region 17, the emitter region 12, the base region 14, and the contact region 15 at the front surface 21 of the semiconductor substrate 10. In the mesa portion 71, emitter regions 12 and contact regions 15 are alternately provided in the extending direction.

The base region 14 is a region of the second conductivity type which is provided on the front surface 21 side of the semiconductor substrate 10. The base region 14 is of the P− type as an example. The base regions 14 may be provided at both end portions of the mesa portion 71 in the Y axis direction at the front surface 21 of the semiconductor substrate 10. It should be noted that FIG. 1A shows only one end portion in the Y axis direction of the base region 14.

The emitter region 12 is a region of a first conductivity type having a higher doping concentration than the drift region 18. The emitter region 12 in this example is of the N+ type as an example. Examples of a dopant of the emitter region 12 include arsenic (As). The emitter region 12 is provided in contact with the gate trench portion 40 at the front surface 21 in the mesa portion 71. The emitter region 12 may be provided to extend in the X axis direction from one to another of two trench portions sandwiching the mesa portion 71. The emitter region 12 is also provided below the contact hole 54.

In addition, the emitter region 12 may be or may not be in contact with the dummy trench portion 30. The emitter region 12 in this example is in contact with the dummy trench portion 30.

The contact region 15 is a region of the second conductivity type provided above the base region 14 and having a higher doping concentration than the base region 14. The contact region 15 in this example is of the P+ type as an example. The contact region 15 in this example is provided at the front surface 21 in the mesa portion 71. The contact region 15 may be provided in the X axis direction from one to another of the two trench portions sandwiching the mesa portion 71. The contact region 15 may be or may not be in contact with the gate trench portion 40 or the dummy trench portion 30. The contact region 15 in this example is in contact with the dummy trench portion 30 and the gate trench portion 40. The contact region 15 is also provided below the contact hole 54.

Figure 1B:
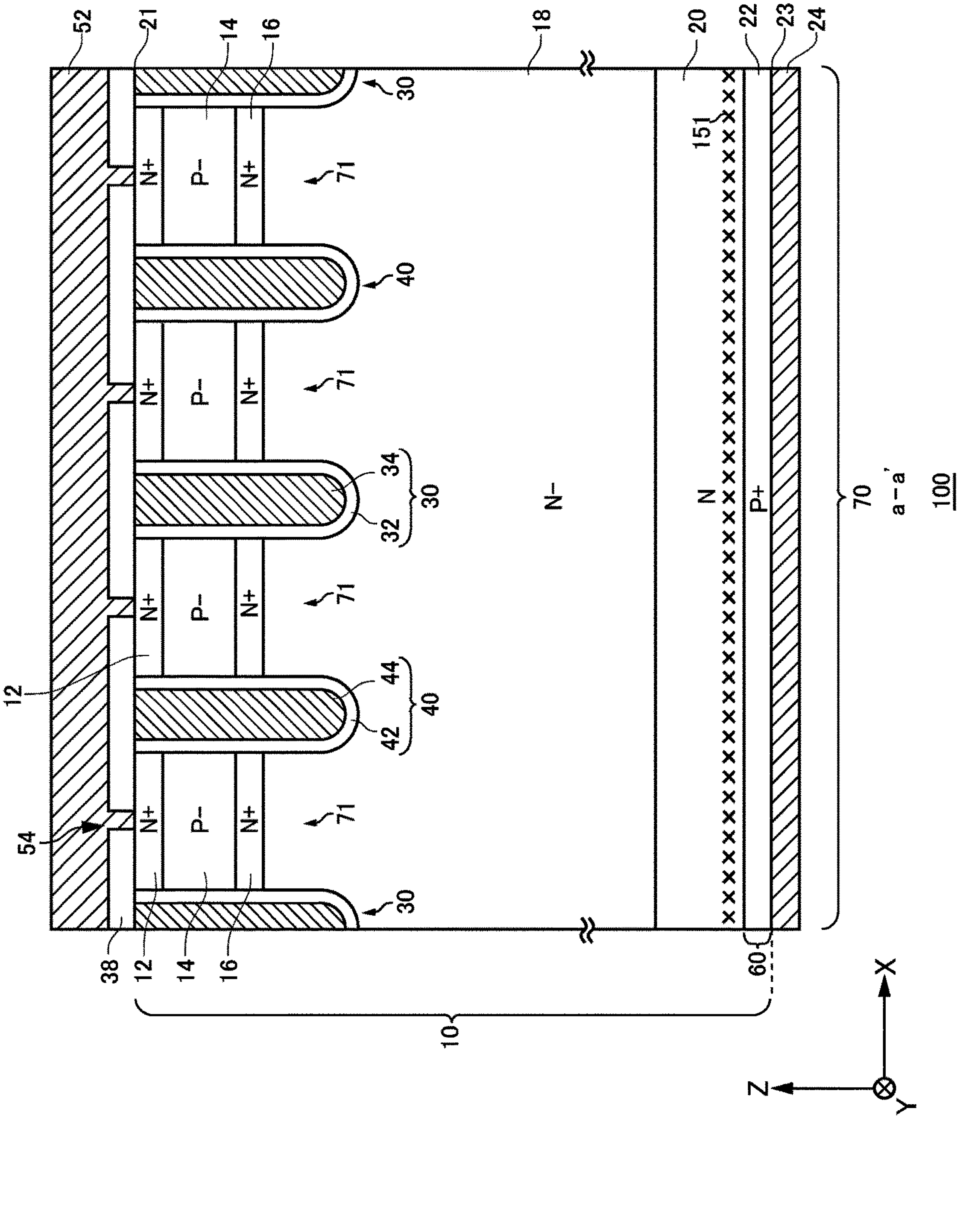
FIG. 1B shows an example of a cross section a-a' in FIG. 1A.

FIG. 1B shows an example of a cross section a-a' in FIG. 1A. The cross section a-a' is an XZ plane which passes through the emitter region 12 in the transistor portion 70. The semiconductor device 100 in this example has the semiconductor substrate 10, the interlayer dielectric film 38, the emitter electrode 52, and a collector electrode 24 in the cross section a-a'. The emitter electrode 52 is formed above the semiconductor substrate 10 and the interlayer dielectric film 38.

The drift region 18 is a region of the first conductivity type which is provided in the semiconductor substrate 10. The drift region 18 in this example is of the N− type as an example. The drift region 18 may be a region which has remained without other doping regions formed in the semiconductor substrate 10. That is, a doping concentration in the drift region 18 may be a doping concentration in the semiconductor substrate 10. The drift region 18 may be a region having a relatively low doping concentration in the semiconductor substrate 10. The drift region 18 may be a region having a portion where an acceptor concentration in a P type region excluding a PN junction or a donor concentration in an N type region is the lowest in the semiconductor substrate 10. A doping concentration distribution in the drift region 18 may be substantially uniform along a depth direction of the semiconductor substrate 10, or may have a distribution with a concentration gradient. Being substantially uniform may mean that the doping concentration is distributed between 50% and 150% of an average concentration in a region extending from 30% to 90% of a thickness in the depth direction of the semiconductor substrate 10. The drift region 18 may be a region where a depletion layer corresponding to 50% or more of an applied voltage is formed in a state where a depletion layer expands inside the semiconductor device 100 according to the applied voltage.

A buffer region 20 is a region of the first conductivity type which is provided on a back surface 23 side of the semiconductor substrate 10 relative to the drift region 18. The buffer region 20 in this example is of the N type as an example. The doping concentration in the buffer region 20 is higher than the doping concentration in the drift region 18. The buffer region 20 may function as a field stop layer which prevents a depletion layer expanding from a lower surface side of the base region 14 from reaching the collector region 22 of the second conductivity type. It should be noted that the buffer region 20 may be omitted.

The back surface side region 60 is provided on the back surface 23 side relative to the drift region 18 in the semiconductor substrate 10. The back surface side region 60 may have the first conductivity type or the second conductivity type. The back surface side region 60 in this example has the second conductivity type, and functions as the collector region 22, but is not limited to this. The back surface side region 60 may have a higher atomic density than the drift region 18. An atomic density will be described below. An upper end of the back surface side region 60 in this example is in contact with a lower end of the buffer region 20. When the buffer region 20 is omitted, the upper end of the back surface side region 60 may be in contact with a lower end of the drift region 18. The back surface side region 60 will be described below. It should be noted that, in the present specification, an upper end may refer to an end portion on the front surface 21 side in the depth direction of the semiconductor substrate 10, and a lower end may refer to an end portion on the back surface 23 side in the depth direction of the semiconductor substrate 10. The upper end and the lower end are not limited to a gravitational direction or to a direction in which the semiconductor device 100 is mounted.

The collector region 22 is provided below the buffer region 20 in the transistor portion 70. The collector region 22 has the second conductivity type. The collector region 22 in this example is of the P+ type as an example.

The collector electrode 24 is formed at the back surface 23 of the semiconductor substrate 10. The collector electrode 24 is formed of a conductive material such as metal. A material of the collector electrode 24 may be the same as or different from the material of the emitter electrode 52.

The base region 14 is a region of the second conductivity type which is provided above the drift region 18. The base region 14 is provided in contact with the gate trench portion 40. The base region 14 may be provided in contact with the dummy trench portion 30.

The emitter region 12 is provided above the base region 14. The emitter region 12 is provided between the base region 14 and the front surface 21. The emitter region 12 is provided in contact with the gate trench portion 40. The emitter region 12 may be or may not be in contact with the dummy trench portion 30.

An accumulation region 16 is a region of the first conductivity type which is provided on the front surface 21 side of the semiconductor substrate 10 relative to the drift region 18. The accumulation region 16 in this example is of the N+ type as an example. It is to be noted that the accumulation region 16 may not be provided.

In addition, the accumulation region 16 is provided in contact with the gate trench portion 40. The accumulation region 16 may be or may not be in contact with the dummy trench portion 30. A doping concentration in the accumulation region 16 is higher than the doping concentration in the drift region 18. An ion implantation dose amount in the accumulation region 16 may be 1.0E+12 $cm^{-2}$ or more and 1.0E+13 $cm^{-2}$ or less. In addition, the ion implantation dose amount in the accumulation region 16 may be 3.0E+12 $cm^{-2}$ or more and 6.0E+12 $cm^{-2}$ or less. Providing the accumulation region 16 can increase a carrier injection enhancement effect (IE effect) to reduce an on-voltage of the transistor portion 70. It should be noted that E means a power of 10, and for example, 1.0E+12 $cm^{-2}$ means $1.0\times10^{12}$ $cm^{-2}$.

One or more gate trench portions 40 and one or more dummy trench portions 30 are provided at the front surface 21. Each trench portion is provided from the front surface 21 to the drift region 18. In a region provided with at least any of the emitter region 12, the base region 14, the contact region 15, or the accumulation region 16, each trench portion also passes through these regions to reach the drift region 18. The configuration of the trench portion passing through the doping region is not limited to the one manufactured in the order of forming the doping region and then forming the trench portion. The configuration of the trench portion passing through the doping region includes a configuration of the doping region being formed between the trench portions after forming the trench portion.

The gate trench portion 40 has a gate trench, a gate dielectric film 42, and a gate conductive portion 44 which are formed at the front surface 21. The gate dielectric film 42 is formed to cover an inner wall of the gate trench. The gate dielectric film 42 may be formed by oxidizing or nitriding a semiconductor on the inner wall of the gate trench. The gate conductive portion 44 is formed farther inward than the gate dielectric film 42 inside the gate trench. The gate dielectric film 42 insulates the gate conductive portion 44 from the semiconductor substrate 10. The gate conductive portion 44 is formed of a conductive material such as polysilicon. The gate trench portion 40 is covered with the interlayer dielectric film 38 on the front surface 21.

The gate conductive portion 44 includes a region facing the base region 14 which is adjacent to the gate conductive portion 44 with the gate dielectric film 42 sandwiched therebetween on the mesa portion 71 side, in the depth direction of the semiconductor substrate 10. When a predetermined voltage is applied to the gate conductive portion 44, a channel is formed by an electron inversion layer in a surface layer of the base region 14 at a boundary in contact with the gate trench.

The dummy trench portion 30 may have the same structure as that of the gate trench portion 40. The dummy trench portion 30 has a dummy trench, a dummy dielectric film 32, and a dummy conductive portion 34 which are formed on the front surface 21 side. The dummy dielectric film 32 is formed covering the inner walls of the dummy trench. The dummy conductive portion 34 is formed inside the dummy trench, and is formed farther inward than the dummy dielectric film 32. The dummy dielectric film 32 insulates the dummy conductive portion 34 from the semiconductor substrate 10. The dummy trench portion 30 is covered with the interlayer dielectric film 38 on the front surface 21.

The interlayer dielectric film 38 is provided above the semiconductor substrate 10. The interlayer dielectric film 38 in this example is provided in contact with the front surface 21. The emitter electrode 52 is provided above the interlayer dielectric film 38. The interlayer dielectric film 38 is provided with one or more contact holes 54 for electrically connecting the emitter electrode 52 to the semiconductor substrate 10. Similarly, the contact hole 55 and the contact hole 56 may be provided to pass through the interlayer dielectric film 38. The interlayer dielectric film 38 may be a Boro-phospho Silicate Glass (BPSG) film, may be a borosilicate glass (BSG) film, may be a Phosphosilicate glass (PSG) film, may be an HTO film, or may be a film obtained by stacking these materials. A thickness of the interlayer dielectric film 38 is, for example, 1.0 μm, but is not limited to this.

A first lifetime control region 151 may be provided in the transistor portion 70. The first lifetime control region 151 is not essential, and may not be provided. The first lifetime control region 151 is a region where a lifetime killer is intentionally formed such as by implanting an impurity inside the semiconductor substrate 10. In an example, the first lifetime control region 151 is formed by implanting helium into the semiconductor substrate 10. Providing the first lifetime control region 151 can reduce a turn-off time, and suppressing a tail current can reduce losses during switching.

The lifetime killer is a recombination center of carriers. The lifetime killer may be a lattice defect. For example, the lifetime killer may be a vacancy, a divacancy, a defect complex of these with elements constituting the semiconductor substrate 10, or dislocation. In addition, the lifetime killer may be a noble gas element such as helium or neon, a metal element such as platinum, or the like. An electron beam may be used to form the lattice defect.

A lifetime killer concentration is a concentration at the recombination center of carriers. The lifetime killer concentration may be a concentration of the lattice defect. For example, the lifetime killer concentration may be a vacancy concentration of a vacancy, a divacancy, or the like, may be a concentration of a defect complex of these vacancies with elements constituting the semiconductor substrate 10, or may be a dislocation concentration. In addition, the lifetime killer concentration may be a chemical concentration of a noble gas element such as helium or neon, or may be a chemical concentration of a metal element such as platinum.

The first lifetime control region 151 is provided on the back surface 23 side relative to a center of the semiconductor substrate 10 in the depth direction of the semiconductor substrate 10. The first lifetime control region 151 in this example is provided in the buffer region 20. The first lifetime control region 151 in this example is provided at an entire surface of the semiconductor substrate 10 in the XY plane, and can be formed without using a mask. The first lifetime control region 151 may be provided in part of the semiconductor substrate 10 in the XY plane. A dose amount of an impurity for forming the first lifetime control region 151 may be 0.5E+10 $cm^{-2}$ or more and 1.0E+13 $cm^{-2}$ or less, or may be 5.0E+10 $cm^{-2}$ or more and 5.0E+11 $cm^{-2}$ or less.

In addition, the first lifetime control region 151 in this example is formed through implantation from the back surface 23 side. This allows avoidance of an influence on the front surface 21 side in the semiconductor device 100. For example, the first lifetime control region 151 is formed through radiation of helium from the back surface 23 side. Here, it can be determined by acquiring a state of the front surface 21 side through the SRP method or measurement of a leakage current whether the first lifetime control region 151 is formed through implantation from the front surface 21 side or through the implantation from the back surface 23 side.

Figure 2A:
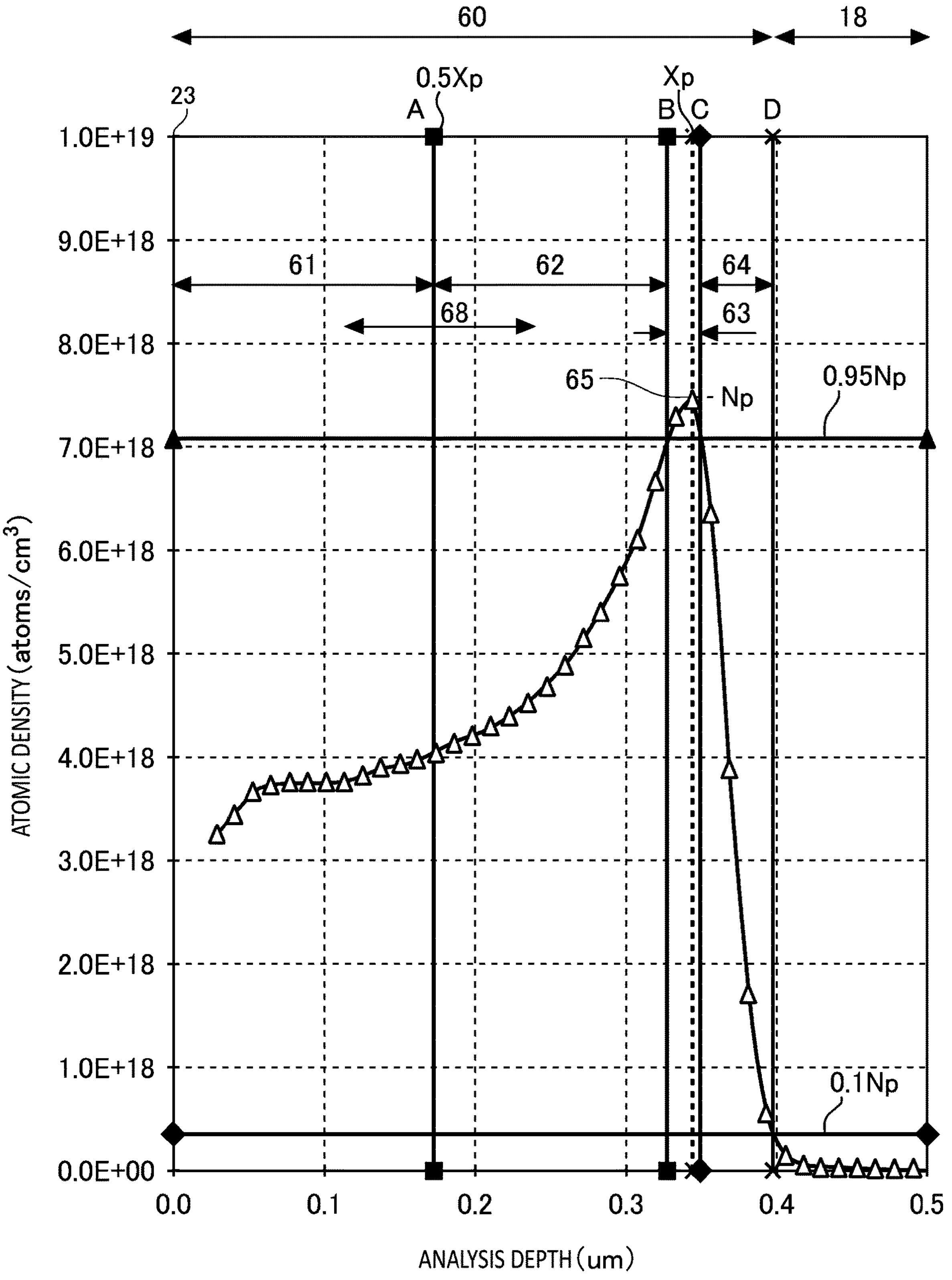
FIG. 2A is an example of a graph showing an atomic density distribution in a back surface side region 60.

FIG. 2A is an example of a graph showing an atomic density distribution in the back surface side region 60. The vertical axis represents an atomic density (atoms/$cm^3$), and the horizontal axis represents an analysis depth (μm) from the back surface 23. A unit of the atomic density may be simply indicated as ($cm^{-3}$). The back surface side region 60 in this example functions as the collector region 22. As an example, the atomic density of boron, which is a dopant in the back surface side region 60, is shown. The back surface side region 60 has a gentle gradient region 61, a steep gradient region 62, a peak region 63, and a decrease region 64. Hereinafter, the atomic density of a dopant may be simply referred to as the atomic density.

The gentle gradient region 61 is a region where the atomic density increases from the back surface 23 side toward the front surface 21 side of the semiconductor substrate 10 in the depth direction of the semiconductor substrate 10. An atomic density gradient in the gentle gradient region 61 may be constant or variable. As described below, there may be a region where the atomic density is not measured in the vicinity of the back surface 23 or a region where the atomic density rapidly decreases toward the back surface 23 side, depending on a characteristic of an analysis means. For the region where the atomic density is not measured or the region where the atomic density rapidly decreases as described above, a region where a measurement value is compensated through extrapolation or the like may also be defined as a region of the gentle gradient region 61.

The steep gradient region 62 is a region which is provided on the front surface 21 side relative to the gentle gradient region 61 and in which the atomic density increases with a gradient steeper than that in the gentle gradient region 61. The steep gradient region 62 is provided on the front surface 21 side relative to the gentle gradient region 61 in the depth direction of the semiconductor substrate 10.

The peak region 63 is provided on the front surface 21 side relative to the steep gradient region 62, and has a peak 65 where the atomic density distribution has a maximum value in a range of the back surface side region 60. The peak region 63 is provided on the front surface 21 side relative to the steep gradient region 62 in the depth direction of the semiconductor substrate 10. The peak region 63 is provided between the steep gradient region 62 and the decrease region 64 in the depth direction of the semiconductor substrate 10.

Np is a peak atomic density at the peak 65. The peak atomic density Np at the peak 65 may be 1.0E+16 $cm^{-3}$ or more, may be 1.0E+17 $cm^{-3}$ or more, or may be 1.0E+18 $cm^{-3}$ or more, in the collector region 22. The peak atomic density Np at the peak 65 may be 1.0E+20 $cm^{-3}$ or less, may be 5.0E+19 $cm^{-3}$ or less, may be 1.0E+19 $cm^{-3}$ or less, or may be 5.0E+18 $cm^{-3}$ or less, in the collector region 22. The peak atomic density Np at the peak 65 in this example is 7.45E+18 $cm^{-3}$. Xp is a depth position of the peak 65 from the back surface 23 in the depth direction of the semiconductor substrate 10. Xp may be 0.1 μm or more, may be 0.2 μm or more, may be 0.3 μm or more, or may be 0.4 μm or more, in the collector region 22. Xp may be 0.8 μm or less, may be 0.6 μm or less, may be 0.5 μm or less, or may be 0.4 μm or less, in the collector region 22.

The decrease region 64 is a region where the atomic density decreases toward the drift region 18 in the depth direction of the semiconductor substrate 10. The decrease region 64 is provided between the peak region 63 and the drift region 18. When the semiconductor device 100 includes the buffer region 20, the decrease region 64 may be provided between the peak region 63 and the buffer region 20, and may be in contact with the buffer region 20.

A lower end of the gentle gradient region 61 may be the back surface 23 of the semiconductor substrate 10. That is, the back surface side region 60 may be provided closest to the back surface 23 of the semiconductor substrate 10. An upper end of the gentle gradient region 61 may be at a position intermediate between the back surface 23 and the depth position of the peak 65 in the peak region 63 in the depth direction of the semiconductor substrate 10. That is, the upper end of the gentle gradient region 61 may be at a position of 0.5 Xp with respect to a depth position Xp of the peak 65. It should be noted that the upper end of the gentle gradient region 61 may be at a position where the atomic density is 0.5 Np with respect to the atomic density Np at the peak 65.

A lower end of the steep gradient region 62 may be at the same position as that of the upper end of the gentle gradient region 61 in the depth direction of the semiconductor substrate 10. That is, the lower end of the steep gradient region 62 may be at the position of 0.5 Xp with respect to the depth position Xp of the peak 65. An upper end of the steep gradient region 62 may be at the same position as that of a lower end of the peak region 63 in the depth direction of the semiconductor substrate 10. The upper end of the steep gradient region 62 may be at a position where the atomic density is 0.95 Np on the back surface 23 side relative to the peak 65, as described below.

The lower end of the peak region 63 may be at a position where an atomic density is 95% of the atomic density at the peak 65 on the back surface 23 side of the semiconductor substrate 10 relative to the peak 65. That is, the lower end of the peak region 63 may be at the position where the atomic density is 0.95 Np on the back surface 23 side relative to the peak 65. An upper end of the peak region 63 may be at a position where an atomic density is 95% of the atomic density at the peak 65 on the front surface 21 side of the semiconductor substrate 10 relative to the peak 65. That is, the upper end of the peak region 63 may be at a position where the atomic density is 0.95 Np on the front surface 21 side relative to the peak 65. In addition, the upper end and the lower end of the peak region 63 may be at positions where atomic densities are respectively 0.90 Np. It should be noted that the lower end of the peak region 63 may be at a position of 0.9 Xp with respect to the depth position Xp of the peak 65. The upper end of the peak region 63 may be at a position of 1.1 Xp with respect to the depth position Xp of the peak 65.

A lower end of the decrease region 64 may be at the same position as that of the upper end of the peak region 63 in the depth direction of the semiconductor substrate 10. That is, the lower end of the decrease region 64 may be at the position where the atomic density is 0.95 Np on the front surface 21 side relative to the peak 65. An upper end of the decrease region 64 may be at a position where an atomic density is 10% of the atomic density at the peak 65 on the front surface 21 side of the semiconductor substrate 10 relative to the peak 65. That is, the upper end of the peak region 63 may be at a position where the atomic density is 0.1 Np on the front surface 21 side relative to the peak 65.

In the back surface side region 60 in this example, the gentle gradient region 61, the steep gradient region 62, the peak region 63, and the decrease region 64 may be continuously provided in order from the back surface 23 side. That is, the upper end of the gentle gradient region 61 may be in contact with the lower end of the steep gradient region 62. The upper end of the steep gradient region 62 may be in contact with the lower end of the peak region 63. The upper end of the peak region 63 may be in contact with the lower end of the decrease region 64. In other words, the semiconductor device 100 may have a boundary A between the gentle gradient region 61 and the steep gradient region 62, may have a boundary B between the steep gradient region 62 and the peak region 63, may have a boundary C between the peak region 63 and the decrease region 64, and may have a boundary D between the decrease region 64 and the drift region 18. As a result of the upper end of the gentle gradient region 61 being in contact with the lower end of the steep gradient region 62, a gradient of the atomic density distribution may continuously increase in the atomic density distribution extending from the gentle gradient region 61 to the steep gradient region 62. This may be able to make an electrical activation rate of the dopant relatively high. In addition, the atomic density distribution extending from the gentle gradient region 61 to the steep gradient region 62 may have a region where the atomic density partially decreases continuously, or may have a portion where the atomic density is partially distributed continuously and flatly. Here, the fact that the atomic density is partially distributed continuously and flatly may mean that, in a range narrower than the gentle gradient region 61 or the steep gradient region 62, a maximum value and a minimum value of the atomic density are within 15% of an average value of the atomic density in the range.

A region including the position intermediate between the back surface 23 and the depth position of the peak 65 in the peak region 63 in the depth direction of the semiconductor substrate 10 and extending from 30% to 70% of a distance from the back surface 23 of the semiconductor substrate 10 to the depth position of the peak 65 is defined as an intermediate region 68. The upper end of the gentle gradient region 61 may be located at any position in the intermediate region 68.

The upper end of the gentle gradient region 61 may be an upper end of a region where a density gradient of the atomic density distribution is relatively low on the back surface 23 side relative to the depth position Xp of the peak 65. In addition, the lower end of the steep gradient region 62 may be a lower end of a region where the density gradient of the atomic density distribution is relatively high on the back surface 23 side relative to the depth position Xp of the peak 65. The upper end of the gentle gradient region 61 or the lower end of the steep gradient region 62 in this case may be located in the intermediate region 68.

The back surface side region 60 in this example functions as the collector region 22. The peak 65 is located away from the back surface 23, and the gentle gradient region 61 and the steep gradient region 62 are provided between the back surface 23 and the peak region 63. This allows the peak region 63 and the decrease region 64 to be formed at a depth of 0.2 μm or more from the back surface 23. An implantation efficiency of charge carriers (holes in this example) may be determined by magnitude of the atomic density at the peak 65 and magnitude of a gradient in the decrease region 64. Here, a doping concentration may be on the same order as the atomic density. For example, even if a scratch is formed on the back surface 23 in a manufacturing process of a semiconductor device or in an assembly process of a module or the like, the implantation efficiency of the charge carriers can be less affected by a depth of the scratch as long as the depth of the scratch is in a range up to the lower end of the peak region 63 (for example, about 0.3 μm). This allows suppression of an increase in an on-voltage caused by the scratch on the back surface 23. As a contact resistance between the back surface side region 60 and an electrode (the collector electrode 24 in this example) which is formed on the back surface 23, any contact resistance may be available as long as the atomic density of the dopant at the back surface 23 is $1\times10^{18}$ (atoms/$cm^3$) or more. On the other hand, when the back surface side region 60 is formed at a depth of, for example, 0.3 μm or more from the back surface 23, the atomic density of the dopant at the back surface 23 may be maximized. In this case, the gradient of the atomic density may be relatively gradual, and it may be impossible to increase the implantation efficiency of the charge carriers. In contrast, the back surface side region 60 including the gentle gradient region 61 and the steep gradient region 62 can form the peak region 63 and the decrease region 64 at a depth position away from the back surface 23, and can steepen the gradient of the atomic density in the decrease region 64. As a result, it is possible to not only increase the implantation efficiency of the charge carriers but also reduce the influence of the scratch formed on the back surface 23. In this manner, the back surface side region 60 in this example not only can enhance carrier implantation by having the peak region 63 and the decrease region 64, but also can be made less affected by the scratch on the back surface 23 by including the gentle gradient region 61 and the steep gradient region 62.

It should be noted that, although the present figure shows the atomic density distribution in the back surface side region 60, a shape of the doping concentration may also be approximately equal. That is, the atomic density distribution in the back surface side region 60 may have a shape substantially similar to that of a distribution of the doping concentration in the back surface side region 60. It is to be noted that not all dopants in the back surface side region 60 become donors or acceptors, and the doping concentration may be 10% or more and 100% or less of the atomic density. In addition, the doping concentration at the peak 65 in the peak region 63 may be 10% or more and 100% or less of the atomic density at the peak 65.

Figure 2B:
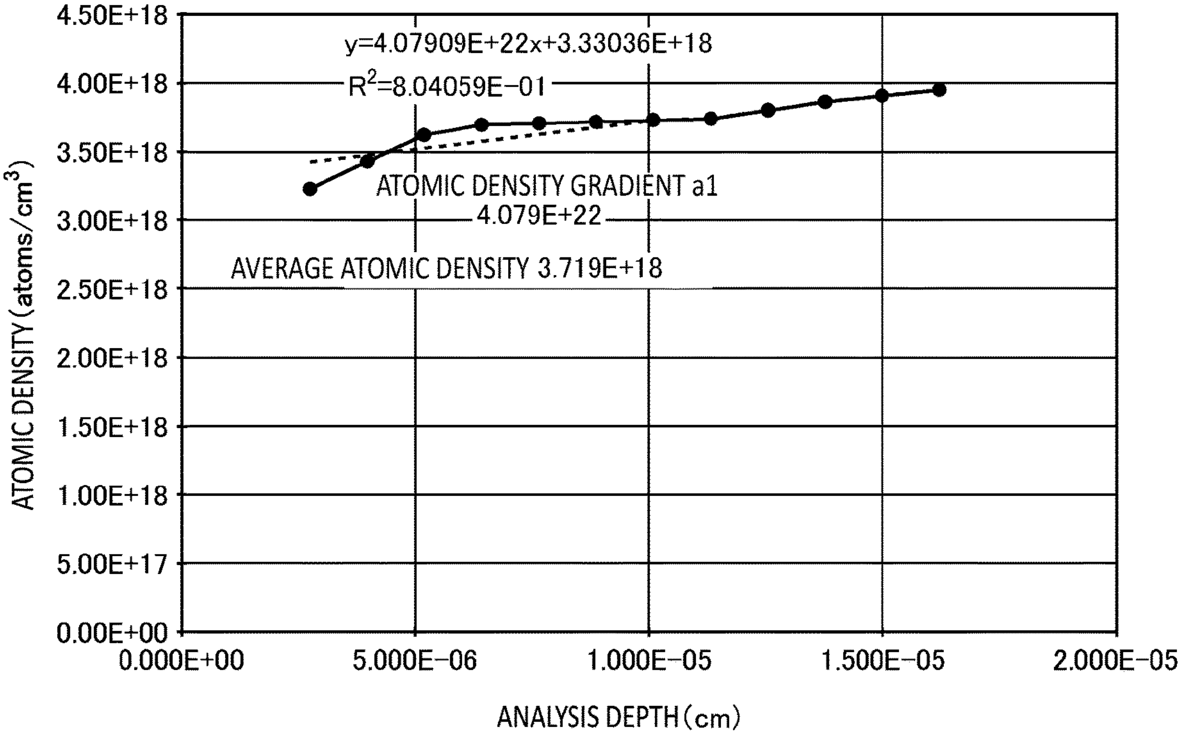
FIG. 2B is an example of a graph showing an atomic density gradient in a gentle gradient region 61.

FIG. 2B is an example of a graph showing an atomic density gradient in the gentle gradient region 61. A unit of the atomic density gradient in this example is (atoms/$cm^4$). The unit of the atomic density gradient may be simply indicated as ($cm^{-4}$). When description of the unit is omitted for the atomic density gradient in the present specification, the unit of the atomic density gradient is (atoms/$cm^4$). As another example, a common logarithm of an atomic density may be used to calculate the atomic density gradient. The unit of the atomic density gradient for a case where the common logarithm of the atomic density is used may be (/cm). In the present specification, description of the unit may be omitted for a value of the atomic density gradient. The unit of the atomic density gradient in this case is (atoms/$cm^4$). The present figure shows an atomic density gradient a1 in the gentle gradient region 61 in FIG. 2A. In the collector region 22, the atomic density gradient a1 in the gentle gradient region 61 may be 1.0E21 or more, may be 5.0E21 or more, may be 1.0E22 or more, or may be 2.0E22 or more. In the collector region 22, the atomic density gradient a1 in the gentle gradient region 61 may be 5.0E23 or less, may be 2.0E23 or less, may be 1.0E23 or less, may be 8.0E22 or less, or may be 5.0E22 or less. The atomic density gradient a1 in this example is 4.079E+22. The atomic density gradient may be calculated by drawing any tangent line by fitting the atomic density distribution obtained by measurement, or may be calculated by another method. It should be noted that, in the present specification, the atomic density gradient is indicated by an absolute value.

An average atomic density in the gentle gradient region 61 may be 20% or more, may be 30% or more, may be 40% or more, or may be 50% or more, of the peak atomic density Np at the peak 65. The average atomic density in the gentle gradient region 61 may be 95% or less, may be 90% or less, may be 85% or less, may be 80% or less, or may be 70% or less, of the peak atomic density Np at the peak 65. The average atomic density in the gentle gradient region 61 in this example is about 3.7E+18 atoms/$cm^3$, and is about 50% of the peak atomic density Np.

Figure 2C:
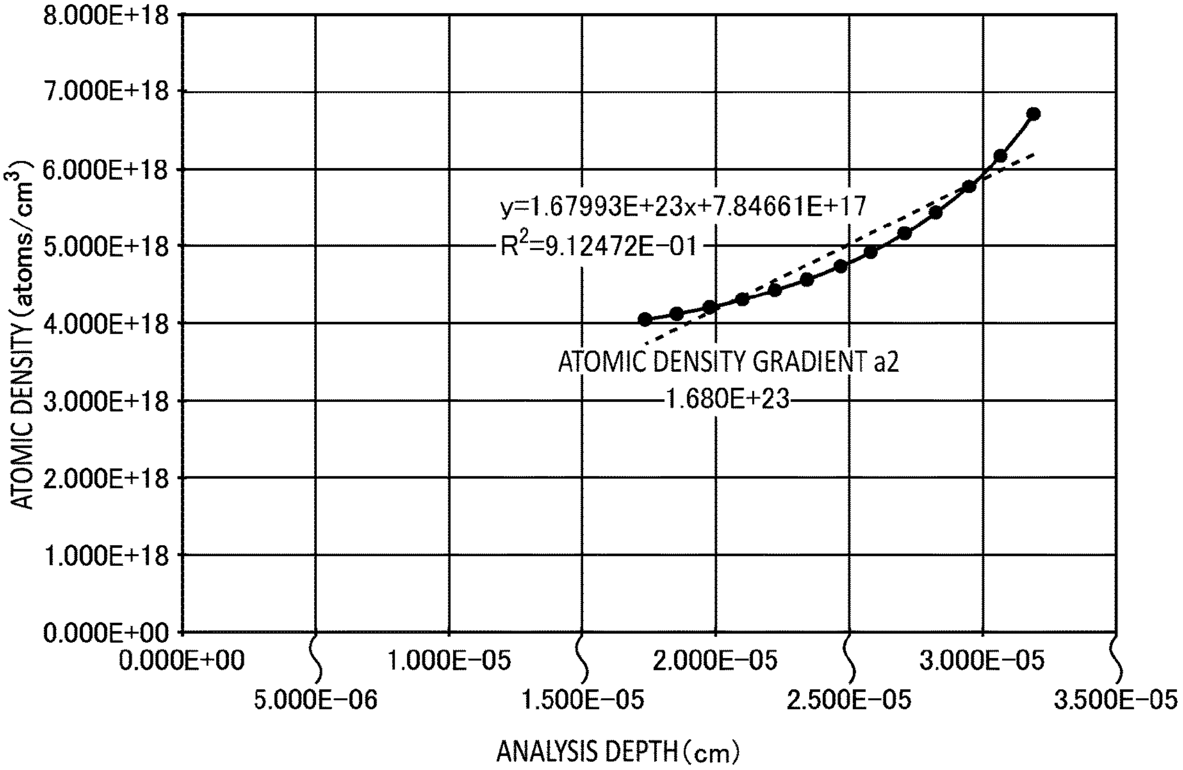
FIG. 2C is an example of a graph showing an atomic density gradient in a steep gradient region 62.

FIG. 2C is an example of a graph showing an atomic density gradient in the steep gradient region 62. The present figure shows an atomic density gradient a2 in the steep gradient region 62 in FIG. 2A. The atomic density gradient a2 in the steep gradient region 62 is steeper than the atomic density gradient a1 in the gentle gradient region 61. In the collector region 22, the atomic density gradient a2 in the steep gradient region 62 may be 1.0E22 or more, may be 2.0E22 or more, may be 5.0E22 or more, or may be 7.0E22 or more. In the collector region 22, the atomic density gradient a2 in the steep gradient region 62 may be 1.0E24 or less, may be 5.0E23 or less, or may be 3.0E23 or less. The atomic density gradient a2 in this example is 1.680E+23.

Figure 2D:
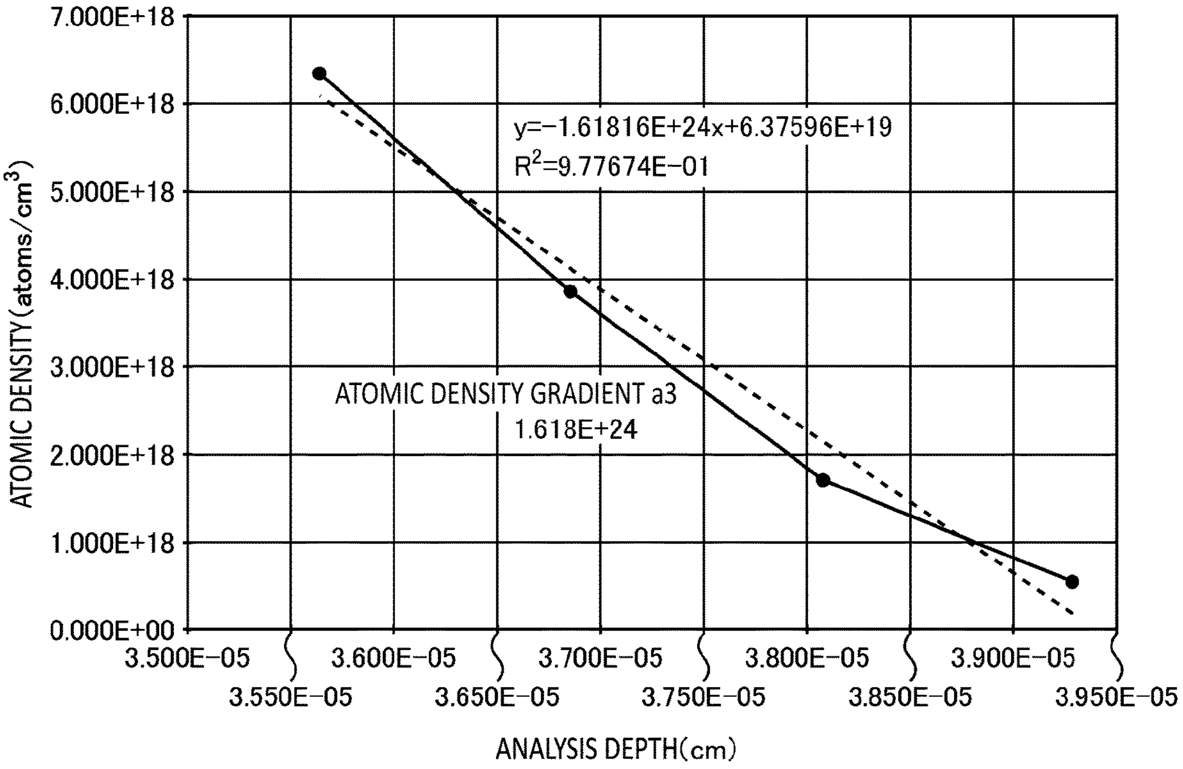
FIG. 2D is an example of a graph showing an atomic density gradient in a decrease region 64.

FIG. 2D is an example of a graph showing an atomic density gradient in the decrease region 64. The present figure shows an atomic density gradient a3 in the decrease region 64 in FIG. 2A. The atomic density gradient a3 takes a positive value because it is an absolute value of a gradient of a graph showing an atomic density distribution in the decrease region 64. In the collector region 22, the atomic density gradient a3 in the decrease region 64 may be 1.0E23 or more, may be 2.0E23 or more, may be 5.0E23 or more, or may be 8.0E23 or more. In the collector region 22, the atomic density gradient a3 in the decrease region 64 may be 1.0E25 or less, may be 8.0E24 or less, may be 5.0E24 or less, or may be 3.0E24 or less. The atomic density gradient a3 in this example is 1.618E+24.

In the collector region 22, an atomic density at the lower end of the gentle gradient region 61 may be 10% or more and 80% or less of the atomic density Np at the peak 65. The atomic density at the lower end of the gentle gradient region 61 may be 30% or more and 60% or less of the atomic density Np at the peak 65. The semiconductor device 100 in this example can use laser annealing to make the atomic density at the back surface 23 higher than when using thermal annealing, and reduce a contact resistance with the collector electrode 24.

In the collector region 22, a ratio α of the atomic density gradient in the gentle gradient region 61 to the atomic density gradient in the steep gradient region 62 may be 0.01 or more and 0.8 or less. The ratio α of the atomic density gradient may be 0.02 or more, may be 0.05 or more, or may be 0.1 or more, in the collector region 22. The ratio α of the atomic density gradient may be 0.5 or less, may be 0.2 or less, or may be 0.1 or less, in the collector region 22.

In the collector region 22, a ratio β of the atomic density gradient in the steep gradient region 62 to the atomic density gradient in the decrease region 64 may be 0.001 or more and 0.5 or less. The ratio β of the atomic density gradient may be 0.005 or more, may be 0.01 or more, or may be 0.05 or more, in the collector region 22. The ratio β of the atomic density gradient may be 0.2 or less, may be 0.1 or less, or may be 0.05 or less, in the collector region 22.

In this manner, appropriately setting the atomic density gradient in each region in the back surface side region 60 can provide the semiconductor device 100 having a good electrical property while suppressing the influence of the scratch on the back surface 23.

Figure 3A:
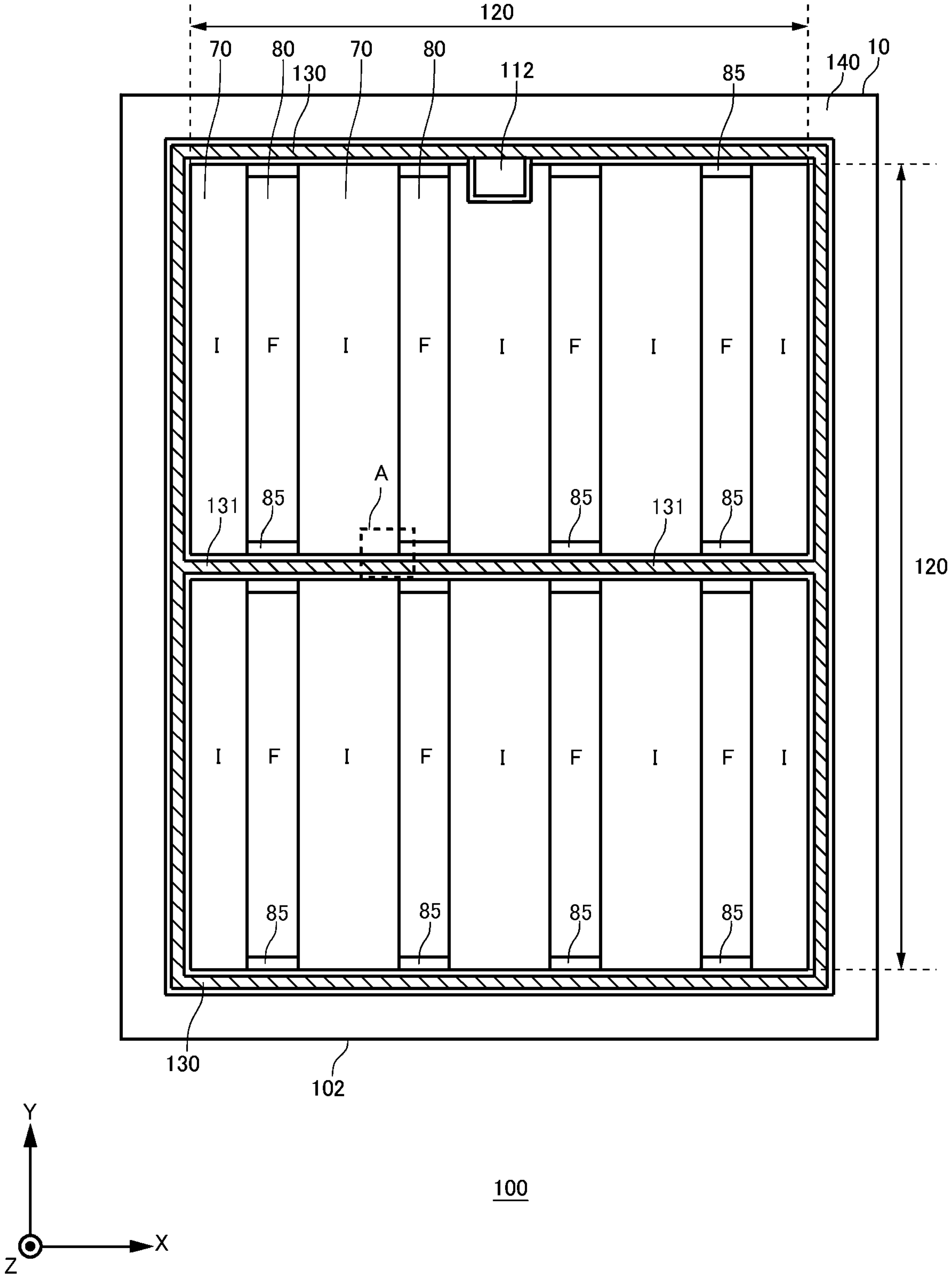
FIG. 3A is an example of a top view showing a modified example of the semiconductor device 100.

FIG. 3A is an example of a top view showing a modified example of the semiconductor device 100. FIG. 3A shows a position at which each member is projected on an upper surface of the semiconductor substrate 10. In FIG. 3A, only some members of the semiconductor device 100 are shown, and some members are omitted.

The semiconductor substrate 10 has an end side 102 in a top view. The semiconductor substrate 10 in this example has two sets of end sides 102 facing each other in a top view. In FIG. 3A, the X axis and the Y axis are parallel to any of the end sides 102.

The semiconductor substrate 10 is provided with an active portion 120. The active portion 120 is a region where a main current flows in the depth direction between the front surface 21 and a back surface 23 of the semiconductor substrate 10 when the semiconductor device 100 operates. The emitter electrode 52 is provided above the active portion 120, but is omitted in FIG. 3A.

The active portion 120 is provided with at least one of the transistor portion 70 including a transistor element such as an IGBT or a diode portion 80 including a diode element such as a freewheeling diode (FWD). In the example of FIG. 3A, transistor portions 70 and diode portions 80 are alternately arranged along a predetermined array direction (the X axis direction in this example) at the front surface 21 of the semiconductor substrate 10. In another example, the active portion 120 may be provided with only one of the transistor portion 70 and the diode portion 80.

In FIG. 3A, a region where each of the transistor portions 70 is arranged is indicated by a symbol "I", and a region where each of the diode portions 80 is arranged is indicated by a symbol F. Each of the transistor portions 70 and each of the diode portions 80 may have a longitudinal length in an extending direction. In other words, a length in the Y axis direction of each of the transistor portions 70 is larger than a width in the X axis direction. Similarly, a length in the Y axis direction of each of the diode portions 80 is larger than a width in the X axis direction. The extending direction of the transistor portion 70 and the diode portion 80 may be the same as a longitudinal direction of each trench portion which will be described below.

Each of the diode portions 80 has a cathode region of the N+ type in a region in contact with the back surface 23 of the semiconductor substrate 10. In the present specification, a region provided with the cathode region is referred to as the diode portion 80. In other words, the diode portion 80 is a region overlapping the cathode region in a top view. On the back surface 23 of the semiconductor substrate 10, the collector region 22 of the P+ type of may be provided in a region other than the cathode region. In the present specification, the diode portion 80 may also include an extension region 85 where the diode portion 80 extends in the Y axis direction to a gate runner which will be described below. The back surface 23 of the extension region 85 is provided with the collector region 22.

The semiconductor device 100 may have one or more pads above the semiconductor substrate 10. The semiconductor device 100 in this example has a gate pad 112. The semiconductor device 100 may have a pad such as an anode pad, a cathode pad, or a current detection pad. Each pad is arranged in the vicinity of the end side 102. The vicinity of the end side 102 refers to a region between the end side 102 and the emitter electrode 52 in a top view. When the semiconductor device 100 is mounted, each pad may be connected to an external circuit via a wiring line such as a wire.

A gate potential is applied to the gate pad 112. The gate pad 112 is electrically connected to the gate conductive portion 44 of the gate trench portion 40 in the active portion 120. The semiconductor device 100 includes a gate runner which connects the gate pad 112 and the gate trench portion 40. In FIG. 3A, the gate runner is hatched with diagonal lines.

The gate runner in this example has an outer circumferential gate runner 130 and an active-side gate runner 131. The outer circumferential gate runner 130 and the active-side gate runner 131 are examples of the gate metal layer 50. The outer circumferential gate runner 130 is arranged between the active portion 120 and the end side 102 of the semiconductor substrate 10 in a top view. The outer circumferential gate runner 130 in this example encloses the active portion 120 in a top view. A region enclosed by the outer circumferential gate runner 130 in a top view may be the active portion 120. In addition, the outer circumferential gate runner 130 is connected to the gate pad 112. The outer circumferential gate runner 130 is arranged above the semiconductor substrate 10. The outer circumferential gate runner 130 may be a metal wiring line containing aluminum or the like.

The active-side gate runner 131 is provided in the active portion 120. Providing the active-side gate runner 131 in the active portion 120 can reduce a variation in wiring line length from the gate pad 112 for each region of the semiconductor substrate 10.

The active-side gate runner 131 is connected to the gate trench portion in the active portion 120. The active-side gate runner 131 is arranged above the semiconductor substrate 10. The active-side gate runner 131 may be a wiring line formed of a semiconductor such as polysilicon doped with an impurity.

The active-side gate runner 131 may be connected to the outer circumferential gate runner 130. The active-side gate runner 131 in this example is provided to extend in the X axis direction so as to cross the active portion 120 from one outer circumferential gate runner 130 to another outer circumferential gate runner 130 at substantially a center in the Y axis direction. When the active portion 120 is divided by the active-side gate runner 131, the transistor portions 70 and the diode portions 80 may be alternately arranged in the X axis direction in each divided region.

In addition, the semiconductor device 100 may include a temperature sensing portion (not shown) which is a PN junction diode formed of polysilicon or the like, and a current detection portion (not shown) which simulates an operation of the transistor portion provided in the active portion 120.

An edge termination structure portion 140 is provided at the front surface 21 of the semiconductor substrate 10. The edge termination structure portion 140 is provided between the active portion 120 and the end side 102 in a top view. The edge termination structure portion 140 in this example is arranged between the outer circumferential gate runner 130 and the end side 102. The edge termination structure portion 140 reduces electric field strength on the front surface 21 side of the semiconductor substrate 10. The edge termination structure portion 140 may include at least one of a guard ring, a field plate, or a RESURF which is annularly provided to enclose the active portion 120.

Figure 3B:
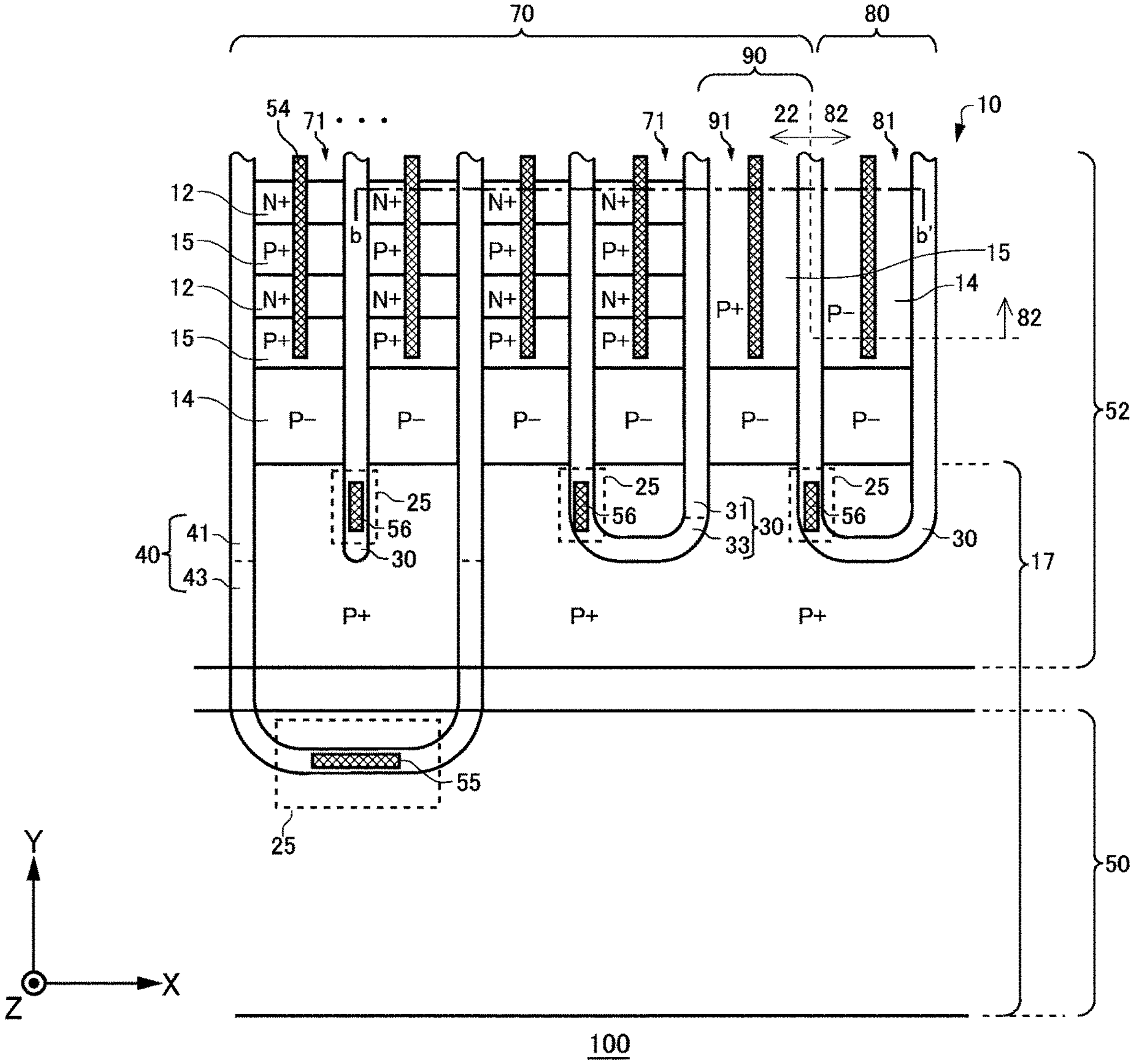
FIG. 3B illustrates an enlarged view of a region A in FIG. 3A.

FIG. 3B illustrates an enlarged view of a region A in FIG. 3A. The region A is a region including the transistor portion 70 and the diode portion 80. The semiconductor device 100 in this example includes the gate trench portion 40, the dummy trench portions 30, the emitter region 12, the base region 14, the contact region 15, and the well region 17, which are provided inside on the upper surface side of the semiconductor substrate 10. Each of the gate trench portion 40 and the dummy trench portions 30 is an example of the trench portion.

Similarly to the gate trench portion 40, each of the dummy trench portions 30 in this example may have a U shape at the front surface 21 of the semiconductor substrate 10. That is, each of the dummy trench portions 30 may have two extending portions 31 which extend along the extending direction and a connecting portion 33 which connects the two extending portions 31.

The semiconductor device 100 in this example includes the emitter electrode 52 and the gate metal layer 50 which are provided above the front surface 21 of the semiconductor substrate 10. The emitter electrode 52 and the gate metal layer 50 are provided separately from each other. The transistor portion 70 in this example includes a boundary portion 90 which is located at a boundary between the transistor portion 70 and the diode portion 80.

The boundary portion 90 is a region provided in the transistor portion 70 and being adjacent to the diode portion 80. The boundary portion 90 has the contact region 15. The boundary portion 90 in this example does not have the emitter region 12. In an example, the trench portions in the boundary portion 90 are the dummy trench portions 30. The boundary portion 90 in this example is arranged such that the dummy trench portions 30 are at its both ends in the X axis direction. The boundary portion 90 is not essential, and may not be provided.

The contact hole 54 is provided above the base region 14 in the diode portion 80. The contact hole 54 is provided above the contact region 15 in the boundary portion 90. No contact holes 54 are provided above the well regions 17 provided at both ends in the Y axis direction.

The mesa portion 91 is provided in the boundary portion 90. The mesa portion 91 has the contact region 15 at the front surface 21 of the semiconductor substrate 10. The mesa portion 91 in this example has the base region 14 and the well region 17 on a negative side in the Y axis direction.

The mesa portion 81 is provided in a region sandwiched between the dummy trench portions 30 adjacent to each other in the diode portion 80. The mesa portion 81 has the base region 14 at the front surface 21 of the semiconductor substrate 10. The mesa portion 81 may have the contact region 15 at the front surface 21 of the semiconductor substrate 10. The mesa portion 81 in this example has the base region 14 and the well region 17 on the negative side in the Y axis direction.

The emitter region 12 is provided in the mesa portion 71, but may not be provided in the mesa portion 81 and the mesa portion 91. The contact region 15 is provided in the mesa portion 71 and the mesa portion 91, but may not be provided in the mesa portion 81.

Figure 3C:
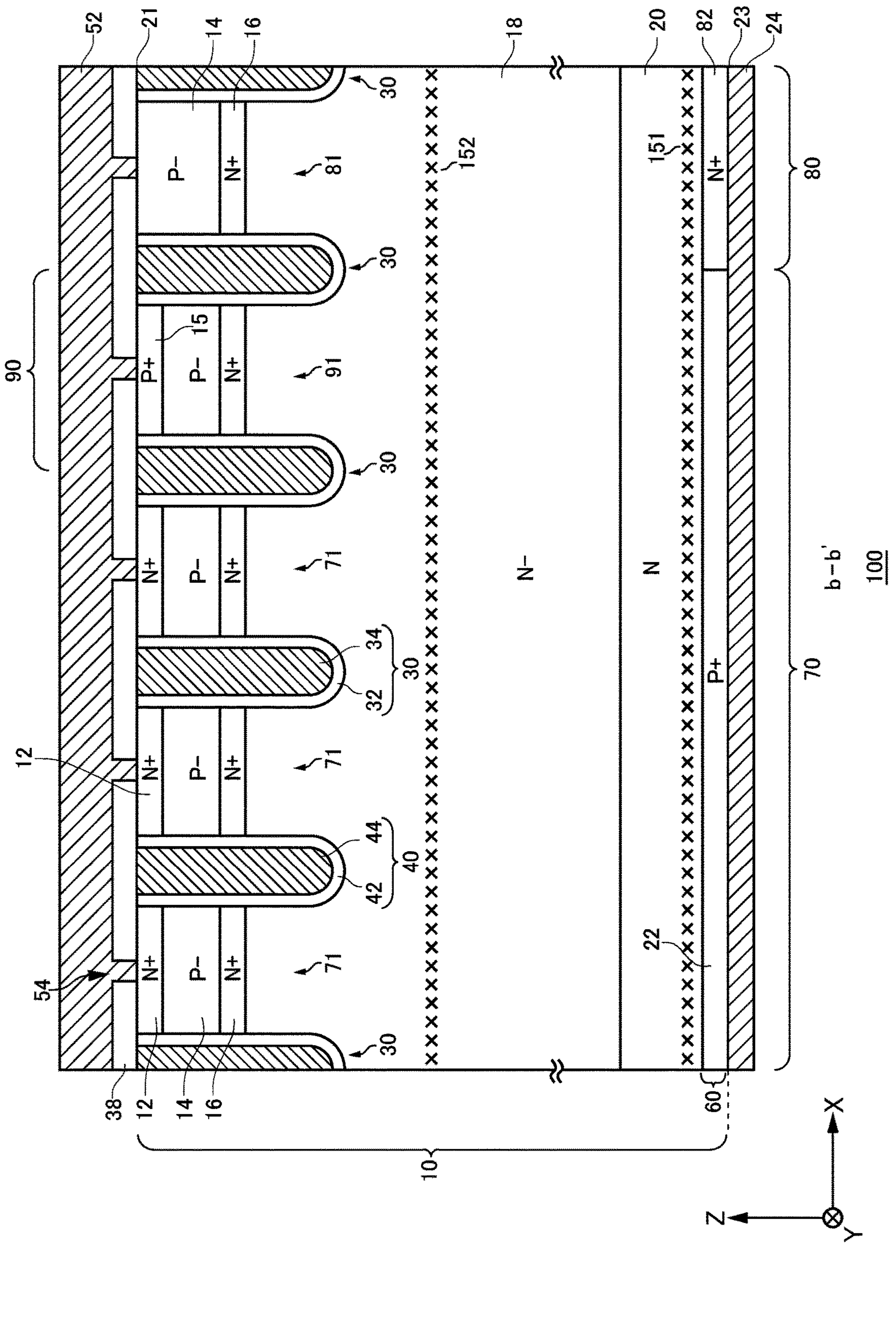
FIG. 3C shows a cross section b-b' of a modified example of the semiconductor device 100.

FIG. 3C shows a cross section b-b' of a modified example of the semiconductor device 100. The present figure corresponds to the cross section b-b' in FIG. 3B. The semiconductor device 100 in this example includes the first lifetime control region 151 and a second lifetime control region 152. The first lifetime control region 151 and the second lifetime control region 152 are not essential, and may not be provided.

The contact region 15 is provided above the base region 14 in the mesa portion 91. The contact region 15 is provided in contact with the dummy trench portion 30 in the mesa portion 91. In another cross section, the contact region 15 may be provided at the front surface 21 in the mesa portion 71.

The accumulation region 16 is provided in the transistor portion 70 and the diode portion 80. The accumulation region 16 in this example is provided at entire surfaces of the transistor portion 70 and the diode portion 80. It is to be noted that the accumulation region 16 may not be provided in the diode portion 80.

A cathode region 82 is provided below the buffer region 20 in the diode portion 80. A boundary between the collector region 22 and the cathode region 82 is a boundary between the transistor portion 70 and the diode portion 80. That is, the collector region 22 is provided below the boundary portion 90 in this example.

The first lifetime control region 151 is provided in both the transistor portion 70 and the diode portion 80. This allows the semiconductor device 100 in this example to speed up recovery in the diode portion 80 and further improve a switching loss. The first lifetime control region 151 may be formed by a method similar to that for forming the first lifetime control region 151 in another exemplary embodiment.

The second lifetime control region 152 is provided on the front surface 21 side relative to a center of the semiconductor substrate 10 in the depth direction of the semiconductor substrate 10. The second lifetime control region 152 in this example is provided in the drift region 18. The second lifetime control region 152 is provided in both the transistor portion 70 and the diode portion 80. The second lifetime control region 152 may be formed by implanting an impurity from the front surface 21 side, or may be formed by implanting an impurity from the back surface 23 side. The second lifetime control region 152 may be provided in the diode portion 80 and the boundary portion 90, and may not be provided in part of the transistor portion 70.

The second lifetime control region 152 may be formed by any method among methods for forming the first lifetime control region 151. An element, a dose amount, and the like for forming the first lifetime control region 151 may be the same as or different from those for forming the second lifetime control region 152.

Figure 4A:
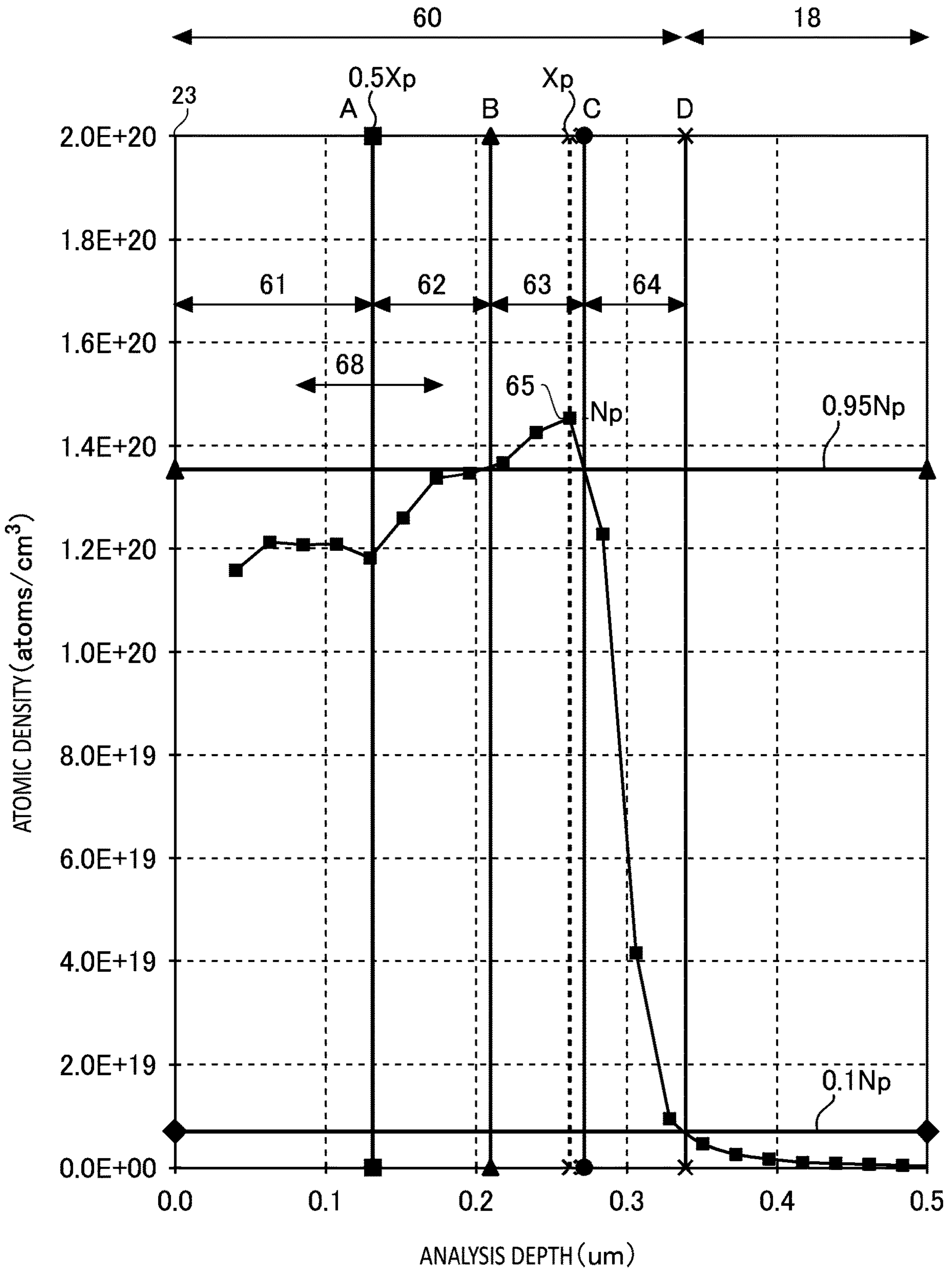
FIG. 4A is an example of a graph showing an atomic density distribution in the back surface side region 60.

FIG. 4A is an example of a graph showing an atomic density distribution in the back surface side region 60. The vertical axis represents an atomic density (atoms/$cm^3$), and the horizontal axis represents an analysis depth (μm). The back surface side region 60 in this example functions as the cathode region 82. As an example, the atomic density of phosphorous, which is a dopant in the back surface side region 60, is shown. The back surface side region 60 has the gentle gradient region 61, the steep gradient region 62, the peak region 63, and the decrease region 64.

Np in this example is the atomic density at the peak 65 in the cathode region 82. The atomic density Np at the peak 65 may be 1.0E+18 $cm^{-3}$ or more, may be 5.0E+18 $cm^{-3}$ or more, or may be 1.0E+19 $cm^{-3}$ or more, in the cathode region 82. The atomic density Np at the peak 65 may be 1.0E21 $cm^{-3}$ or less, may be 5.0E+21 $cm^{-3}$ or less, or may be 1.0E+20 $cm^{-3}$ or less, in the cathode region 82. The atomic density Np at the peak 65 in this example is 1.43E+20 $cm^{-3}$. Xp may be 0.1 μm or more, may be 0.2 μm or more, or may be 0.3 μm or more, in the cathode region 82. Xp may be 0.8 μm or less, may be 0.6 μm or less, or may be 0.4 μm or less, in the cathode region 82.

The back surface side region 60 in this example functions as the cathode region 82, and carriers are easily implanted with the atomic density distribution as in this example. Especially, carriers are easily implanted with a gradient in the decrease region 64 made steep. This makes it easy to implant holes when a diode is turned on, and allows improvement of an on-characteristic of the semiconductor device 100.

Figure 4B:
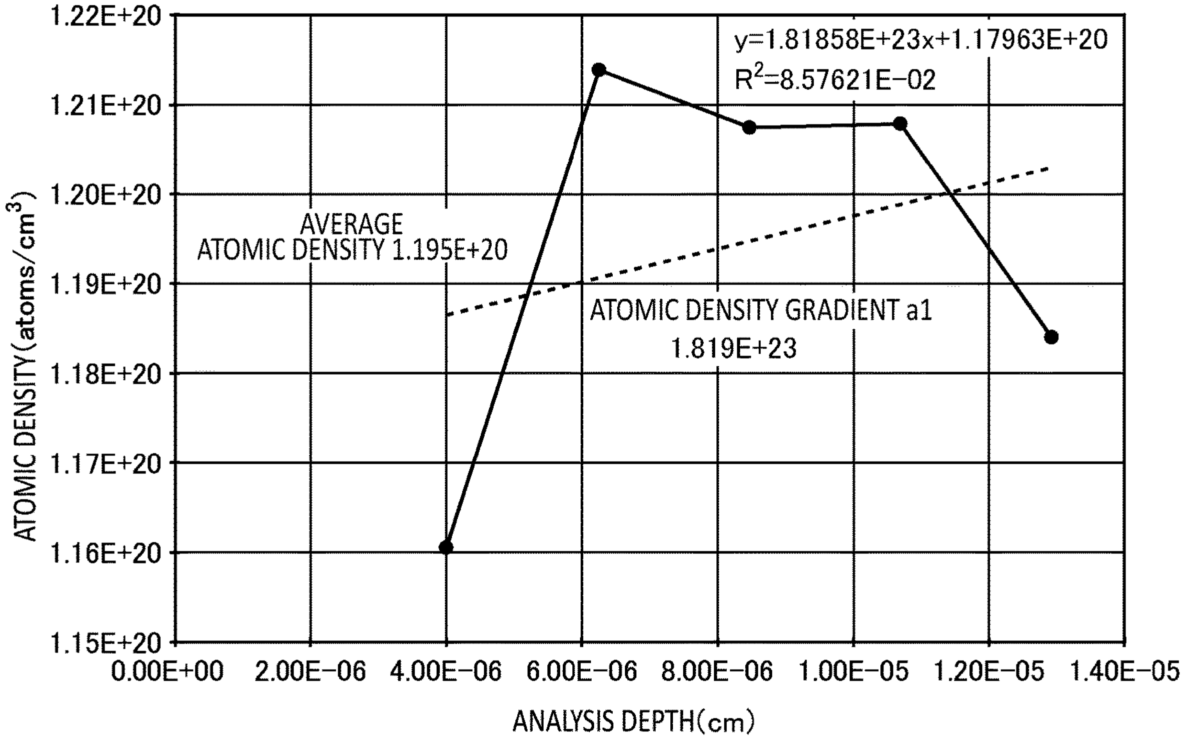
FIG. 4B is an example of a graph showing an atomic density gradient in the gentle gradient region 61.

FIG. 4B is an example of a graph showing an atomic density gradient in the gentle gradient region 61. The present figure shows an atomic density gradient a1 in the gentle gradient region 61 in FIG. 4A. In the cathode region 82, the atomic density gradient a1 in the gentle gradient region 61 may be 1.0E22 or more, may be 3.0E22 or more, may be 5.0E22 or more, or may be 8.0E22 or more. In the cathode region 82, the atomic density gradient a1 in the gentle gradient region 61 may be 2.0E24 or less, may be 1.0E24 or less, may be 8.0E23 or less, or may be 5.0E23 or less. The atomic density gradient a1 in this example is 1.819E+23.

In the cathode region 82, an average atomic density in the gentle gradient region 61 may be 20% or more, may be 30% or more, may be 40% or more, or may be 50% or more, of the peak atomic density Np at the peak 65. The average atomic density in the gentle gradient region 61 may be 95% or less, may be 90% or less, may be 85% or less, may be 80% or less, or may be 70% or less, of the peak atomic density Np at the peak 65. The average atomic density in the gentle gradient region 61 in this example is about 1.2E+20 atoms/$cm^3$, and is about 82% of the peak atomic density Np.

Figure 4C:
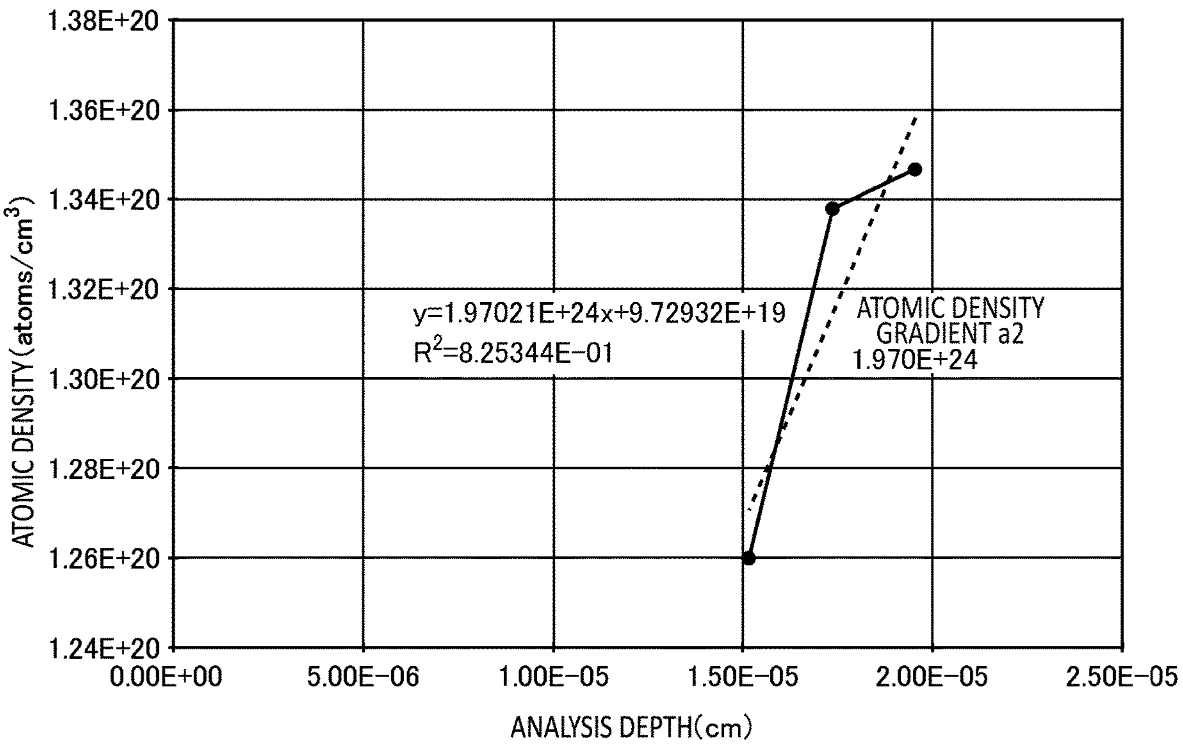
FIG. 4C is an example of a graph showing an atomic density gradient in the steep gradient region 62.

FIG. 4C is an example of a graph showing an atomic density gradient in the steep gradient region 62. The present figure shows an atomic density gradient a2 in the steep gradient region 62 in FIG. 4A. The atomic density gradient a2 in the steep gradient region 62 is steeper than the atomic density gradient a1 in the gentle gradient region 61. In the cathode region 82, the atomic density gradient a2 in the steep gradient region 62 may be 1.0E23 or more, may be 2.0E23 or more, may be 5.0E23 or more, or may be 8.0E23 or more. In the cathode region 82, the atomic density gradient a2 in the steep gradient region 62 may be 1.0E25 or less, may be 8.0E24 or less, may be 5.0E24 or less, or may be 3.0E24 or less. The atomic density gradient a2 in this example is 1.970E+24.

Figure 4D:
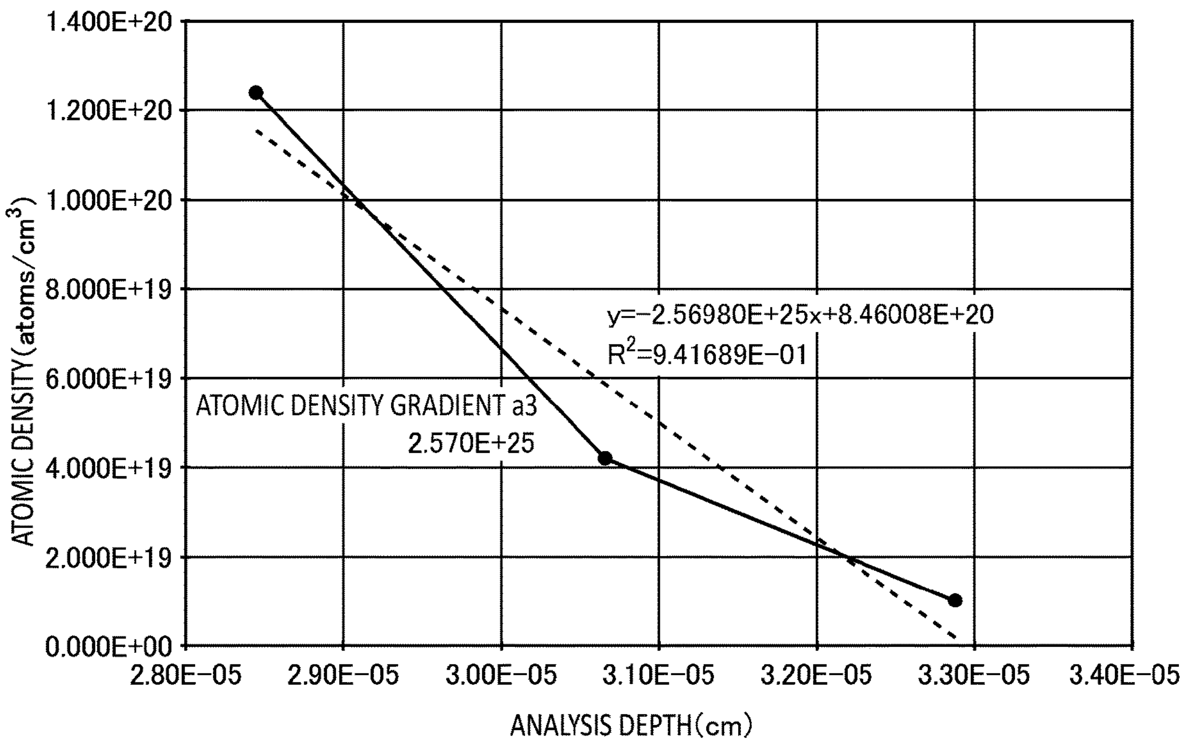
FIG. 4D is an example of a graph showing an atomic density gradient in the decrease region 64.

FIG. 4D is an example of a graph showing an atomic density gradient in the decrease region 64. The present figure shows an atomic density gradient a3 in the decrease region 64 in FIG. 4A. The atomic density gradient a3 takes a positive value because it is an absolute value of a gradient of a graph showing an atomic density distribution in the decrease region 64. In the cathode region 82, the atomic density gradient a3 in the decrease region 64 may be 2.0E24 or more, may be 5.0E24 or more, may be 8.0E24 or more, or may be 1.0E25 or more. In the cathode region 82, the atomic density gradient a3 in the decrease region 64 may be may be 2.0E26 or less, 1.0E26 or less, may be 8.0E25 or less, or may be 5.0E25 or less. The atomic density gradient a3 in this example is 2.570E+25.

In the cathode region 82, an atomic density at a lower end of the gentle gradient region 61 may be 30% or more and 90% or less of the atomic density Np at the peak 65. The atomic density at the lower end of the gentle gradient region 61 may be 50% or more and 80% or less of the atomic density Np at the peak 65. The semiconductor device 100 in this example can use laser annealing to make the atomic density at the back surface 23 higher than when using thermal annealing, and reduce a contact resistance with the collector electrode 24.

In the cathode region 82, a ratio α of the atomic density gradient in the gentle gradient region 61 to the atomic density gradient in the steep gradient region 62 may be 0.01 or more and 0.5 or less. The ratio α of the atomic density gradient may be 0.02 or more, may be 0.05 or more, or may be 0.1 or more, in the cathode region 82. The ratio α of the atomic density gradient may be 0.3 or less, may be 0.2 or less, or may be 0.1 or less, in the cathode region 82.

In the cathode region 82, a ratio β of the atomic density gradient in the steep gradient region 62 to the atomic density gradient in the decrease region 64 may be 0.001 or more and 0.3 or less. The ratio β of the atomic density gradient may be 0.005 or more, may be 0.01 or more, or may be 0.05 or more, in the cathode region 82. The ratio β of the atomic density gradient may be 0.2 or less, may be 0.1 or less, or may be 0.08 or less, in the cathode region 82.

The back surface side region 60 in this example functions as the cathode region 82. The peak 65 is located away from the back surface 23, and the gentle gradient region 61 and the steep gradient region 62 are provided between the back surface 23 and the peak region 63. This allows the peak region 63 and the decrease region 64 to be formed at a depth of 0.1 μm or more from the back surface 23. An implantation efficiency of charge carriers (electrons in this example) may be determined by magnitude of the atomic density at the peak 65 and magnitude of a gradient in the decrease region 64. Here, a doping concentration may be on the same order as the atomic density. For example, even if a scratch is formed on the back surface 23 in a manufacturing process of a semiconductor device or in an assembly process of a module or the like, the implantation efficiency of the charge carriers can be less affected by a depth of the scratch as long as the depth of the scratch is in a range from the back surface 23 to a lower end of the peak region 63 (for example, about 0.2 μm). This allows suppression of an increase in a forward voltage drop caused by the scratch on the back surface 23. As a contact resistance between the back surface side region 60 and a back surface electrode (the collector electrode 24 in this example) which is formed on the back surface 23, any contact resistance may be available as long as the atomic density of the dopant at the back surface 23 is $1\times10^{18}$ (atoms/$cm^3$) or more. On the other hand, when the back surface side region 60 is formed at a depth of, for example, 0.2 μm or more from the back surface 23, the atomic density of the dopant at the back surface 23 may be maximized. In this case, the gradient of the atomic density may be relatively gradual, and it may be impossible to increase the implantation efficiency of the charge carriers. In contrast, the back surface side region 60 including the gentle gradient region 61 and the steep gradient region 62 can form the peak region 63 and the decrease region 64 at a depth position away from the back surface 23, and can steepen the gradient of the atomic density in the decrease region 64. As a result, it is possible to not only increase the implantation efficiency of the charge carriers but also reduce the influence of the scratch formed on the back surface 23. In this manner, the back surface side region 60 in this example not only can enhance carrier implantation by having the peak region 63 and the decrease region 64, but also can be made less affected by the scratch on the back surface 23 by including the gentle gradient region 61 and the steep gradient region 62.

When the back surface side region 60 functions as the cathode region 82, a depletion layer may reach the cathode region 82. When the depletion layer reaches the back surface electrode, a leakage current increases. In order to prevent the depletion layer from reaching the back surface electrode, increasing the doping concentration in the cathode region 82, that is, the atomic density of the dopant in the cathode region 82 can stop the depletion layer inside the cathode region 82, and prevent the depletion layer from reaching the back surface electrode. On the other hand, when the scratch is formed on the back surface 23 as described above, the depletion layer reaching the back surface electrode at the scratch on the back surface 23 may increase the leakage current. Especially, for a density distribution in which the atomic density of the dopant at the back surface 23 is maximized, the atomic density in the cathode region 82 is relatively low at an edge of the scratch on the front surface 21 side. Therefore, the depletion layer easily reaches the back surface electrode at the scratch on the back surface 23. As in this example, locating the peak 65 away from the back surface 23 and providing the gentle gradient region 61 and the steep gradient region 62 between the back surface 23 and the peak region 63 can make the peak region 63 or the steep gradient region 62 deeper than the edge of the scratch on the back surface 23. This allows the depletion layer to be stopped in the peak region 63, the steep gradient region 62, or the gentle gradient region 61, to suppress an increase in the leakage current.

In this manner, appropriately setting the atomic density gradient in each region in the back surface side region 60 can provide the semiconductor device 100 having a good electrical property while enhancing a carrier implantation from the back surface side region 60. In addition, since the back surface side region 60 in this example functions as the cathode region 82 and can stop the depletion layer at the peak 65 away from the back surface 23, the increase in the leakage current caused by the scratch on the back surface 23 can be suppressed as long as the depth of the scratch is in a range, for example, from the back surface 23 to the gentle gradient region 61 and the steep gradient region 62 even if the scratch is formed on the back surface 23.

Figure 5:
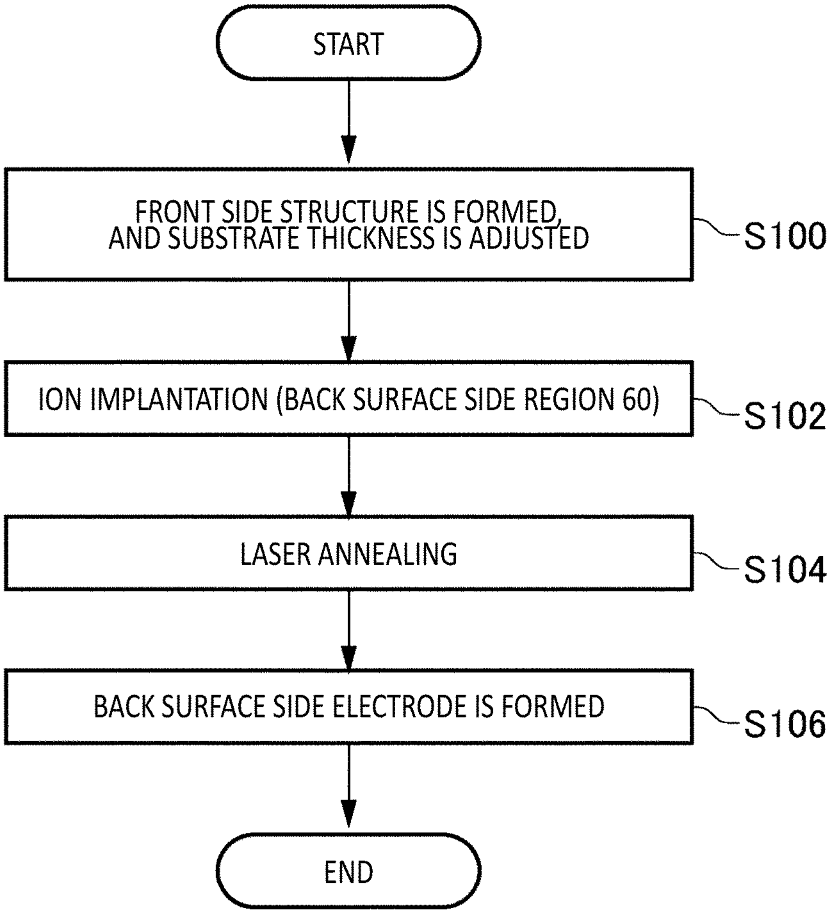
FIG. 5 is a flowchart showing an example of a manufacturing step of the semiconductor device 100.

FIG. 5 is a flowchart showing an example of a manufacturing step of the semiconductor device 100. In Step S100, a structure on the front surface 21 side in the semiconductor device 100 is formed. In addition, in Step S100, the structure on the front surface 21 side is formed, and then the back surface 23 side of the semiconductor substrate 10 is ground to adjust a thickness of the semiconductor substrate 10 according to a required electrical characteristic such as a breakdown voltage.

Step S102, a dopant for forming the back surface side region 60 is ion-implanted from the back surface 23 side of the semiconductor substrate 10. The back surface side region 60 may be formed at an entire surface of the back surface 23 of the semiconductor substrate 10. When the back surface side region 60 is the collector region 22, the dopant may be boron. When the back surface side region 60 is the cathode region 82, the dopant may be phosphorous. When the back surface side region 60 includes both the collector region 22 and the cathode region 82, dopants for the collector region 22 and the cathode region 82 may be separately ion-implanted into each region.

A dose amount of the dopant for forming the collector region 22 may be 2.0E+13 $cm^{-2}$ or more, and may be 5.0E+13 $cm^{-2}$ or less. A dose amount of the dopant for forming the cathode region 82 may be 1.0E14 $cm^{-3}$ or more, and may be 1.0E16 $cm^{-2}$ or less. Acceleration energy for ion implantation for forming the back surface side region 60 may be 10 keV or more and 300 keV or less in the collector region 22 or the cathode region 82.

In Step S104, the semiconductor substrate 10 is laser annealed from the back surface 23 side of the semiconductor substrate 10. In this example, a region into which the dopant has been ion-implanted in the back surface side region 60 is laser annealed. Through laser annealing, the region into which the dopant has been ion-implanted is selectively heated from the back surface 23 side of the semiconductor substrate 10. Use of the laser annealing can raise temperature of a region of a few μm on a laser radiated surface to a temperature required for activation of the dopant while keeping a non-radiated region to which a laser is not radiated at a low temperature. This allows the back surface side region 60 having the peak 65 to be formed.

When the back surface side region 60 includes the collector region 22 and the cathode region 82, the collector region 22 and the cathode region 82 may be each laser annealed at the same time, or may be separately laser annealed. A position of a peak for the dopant for forming the back surface side region 60 can be varied during recrystallization of the semiconductor substrate 10 melted through the laser annealing. As a result, the gentle gradient region 61, the steep gradient region 62, the peak region 63, and the decrease region 64 are each formed.

A type of the laser used to anneal the back surface side region 60 is not particularly limited. The laser used to anneal the back surface side region 60 may be an XeCl excimer laser (wavelength: 308 nm), may be a KrF excimer laser (wavelength: 248 nm), may be an XeF excimer laser (wavelength: 351 nm), may be a YAG2ω (a second harmonic of a YAG) (wavelength: 532 nm) as a solid-state laser, or may be a YAG3ω (a third harmonic of the YAG) (wavelength: 355 nm). The type of the laser used to anneal the back surface side region 60 may be a laser of which a laser beam penetration depth is, for example, 5 μm or less.

It should be noted that a stage for forming the back surface side region 60 may not include thermal annealing for forming the back surface side region 60. That is, recovery of a defect and the activation of the dopant in the back surface side region 60 may be realized only through the laser annealing. It is to be noted that the recovery of the defect and the activation of the dopant in the back surface side region 60 may be realized by using the thermal annealing in addition to the laser annealing. The thermal annealing may be furnace annealing in which the semiconductor device 100 is heated in a furnace.

In Step S106, a back surface side electrode is formed. The back surface side electrode may be the collector electrode 24, or may be a cathode electrode. For example, the back surface side electrode is formed through sputtering. The back surface side electrode may be a laminated electrode in which an aluminum layer, a titanium layer, a nickel layer, and the like are laminated. Such a step can manufacture the semiconductor device 100 including the back surface side region 60. It should be noted that when another region such as the buffer region 20 or the first lifetime control region 151 are formed on the back surface 23 side of the semiconductor substrate 10, a step for forming these regions may be appropriately added.

Figure 6:
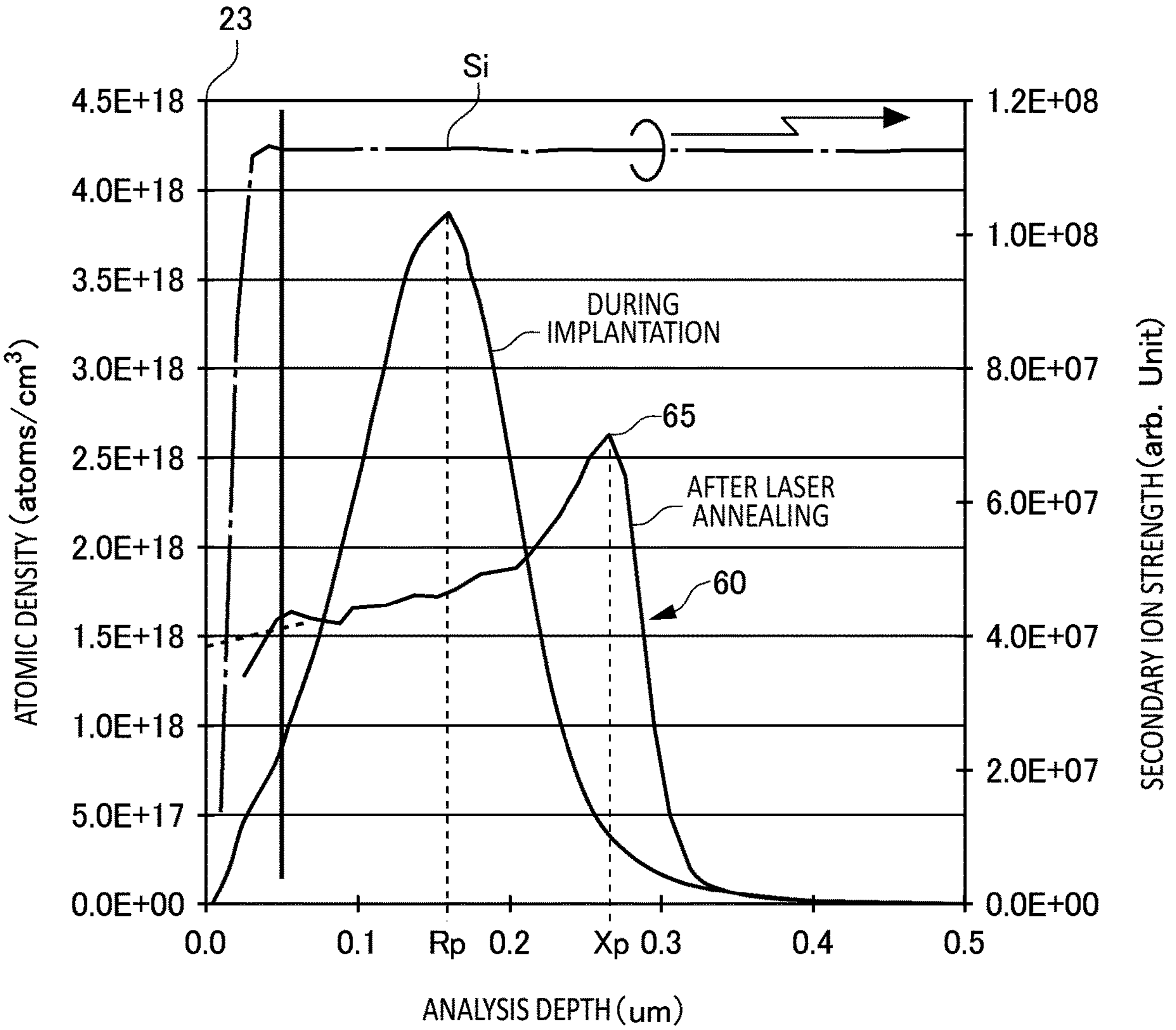
FIG. 6 shows atomic density distributions before and after laser annealing the back surface side region 60.

FIG. 6 shows atomic density distributions before and after laser annealing the back surface side region 60. The vertical axis represents an atomic density (atoms/$cm^3$) and secondary ion strength (arb.Unit) of silicon, and the horizontal axis represents an analysis depth (μm) from the back surface 23.

Solid lines indicate atomic density distributions in the back surface side region 60 during ion implantation and after the laser annealing. A dopant in the back surface side region 60 in this example is boron. During the ion implantation in the back surface side region 60, an atomic density distribution has a peak at a position with a depth of a projected range Rp. During the ion implantation may be a stage before annealing the back surface side region 60. The depth position Xp of the peak 65 after the laser annealing is greater than the projected range Rp at the peak during the ion implantation. In this example, the peak in the atomic density distribution is redistributed at a position on the front surface 21 side of the semiconductor substrate 10 relative to a peak position in the atomic density distribution after the ion implantation, by melting a radiated region of the semiconductor substrate 10 through the laser annealing.

A depth position of the semiconductor substrate 10 melted through the laser annealing may be appropriately changed depending on the atomic density distribution in or a material of the back surface side region 60, or the like. A radiation depth of the laser annealing, especially a melting depth through the laser annealing may include a region from the back surface 23 of the semiconductor substrate 10 to the projected range Rp at the peak during the ion implantation, may include a region from the back surface 23 to the depth position Xp of the peak 65, or may include all region where the back surface side region 60 is formed. That is, the melting depth may be equal to or larger than the projected range Rp at the peak during the ion implantation. For laser radiation, the semiconductor substrate 10 is horizontally arranged with a radiated surface (the back surface 23 in this example) to which a laser is radiated facing upward among principal surfaces of the semiconductor substrate 10 in a wafer state. The melting depth being equal to or larger than the projected range Rp at the peak during the ion implantation can arrange 50% or more of a total amount of implanted dopants inside the melted semiconductor material. As a result, the atomic density of the implanted dopant is redistributed substantially uniformly in a range of the melting depth. Furthermore, relatively long melting time leads to precipitation of the dopant on an installation surface (the front surface 21 in this example) side, which is a principal surface opposite to the radiated surface, along the gravity in the range of the melting depth. Since the dopant moves to the front surface 21 side due to the precipitation, the peak position moves to the projected range Rp at the peak during the ion implantation or to a position deeper than that, in the atomic density distribution of the dopant. Furthermore, the movement of the dopant forms the gentle gradient region 61, the steep gradient region 62, the peak region 63, and the decrease region 64 in order from the back surface 23 side toward the front surface 21 side. It is possible to form the back surface side region 60 having the gentle gradient region 61, the steep gradient region 62, the peak region 63, and the decrease region 64 by setting conditions of the laser annealing (for example, laser beam strength, radiation time, the number of radiations and a time interval, an overlap rate, and the like) such that the semiconductor material is melted and the dopant is redistributed and is further precipitated on the installation surface side.

A dashed line graph shows a measurement result of the secondary ion strength of silicon, which is the semiconductor substrate 10. In a region close to (for example, a region 0.05 μm or less from) the back surface 23, the measurement result is not stable, and the secondary ion strength of silicon has not been accurately measured. That is, the atomic density of the dopant in the back surface side region 60 may also not have been able to be accurately measured. Thus, in a region in the vicinity of the back surface 23, a measurement value of the atomic density in the back surface side region 60 may be compensated through extrapolation or the like.

It should be noted that an integral concentration in the back surface side region 60 may decrease through laser annealing radiation. A ratio of the integral concentration in the back surface side region 60 after the laser annealing to the integral concentration in the back surface side region 60 before the laser annealing may be 85% or more, may be 90% or more, or may be 95% or more, when the dopant is boron. The ratio of the integral concentration in the back surface side region 60 after the laser annealing to the integral concentration in the back surface side region 60 before the laser annealing may be less than 100%, may be 99% or less, or may be 95% or less, when the dopant is boron. The ratio of the integral concentration in this example is 97%. The same may apply when the dopant is phosphorous or arsenic.

Figure 7:
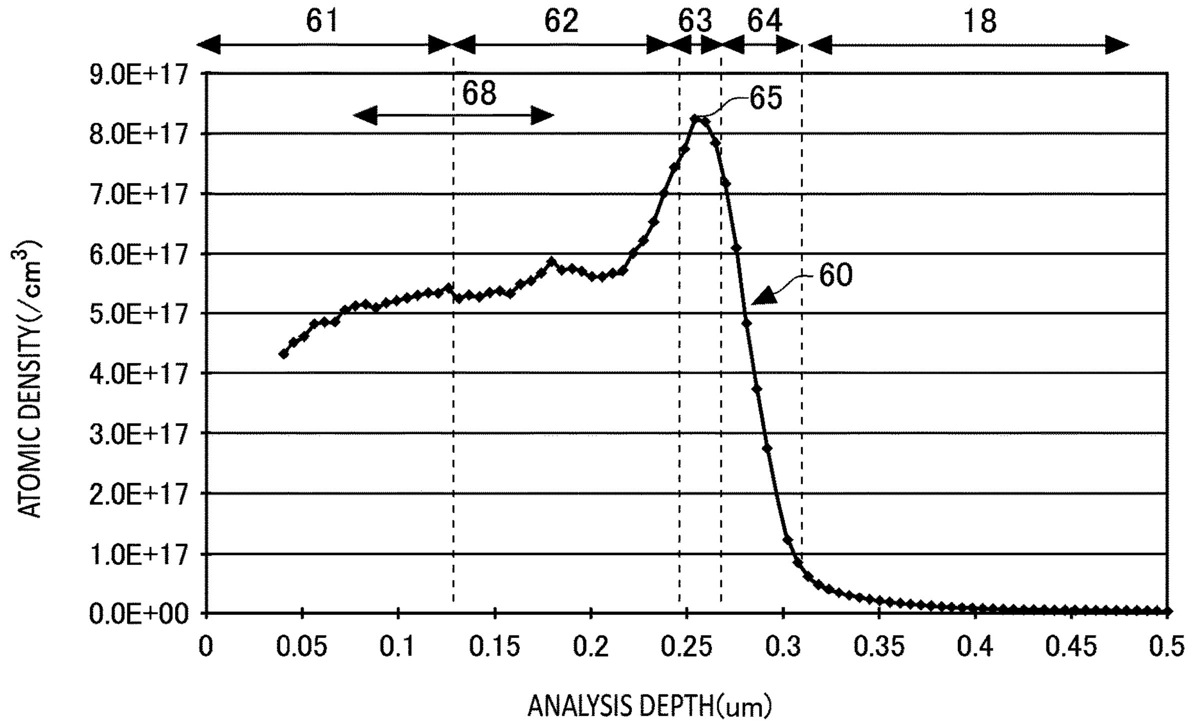
FIG. 7 shows a measurement result of an atomic density on a back surface 23 side of a semiconductor substrate 10.

FIG. 7 shows a measurement result of an atomic density on the back surface 23 side of the semiconductor substrate 10. The present figure shows an analysis result of a secondary ion measured by the SIMS. Also in the result in this example, as shown in another exemplary embodiment, the back surface side region 60 has the gentle gradient region 61, the steep gradient region 62, the peak region 63, and the decrease region 64.

Figure 8:
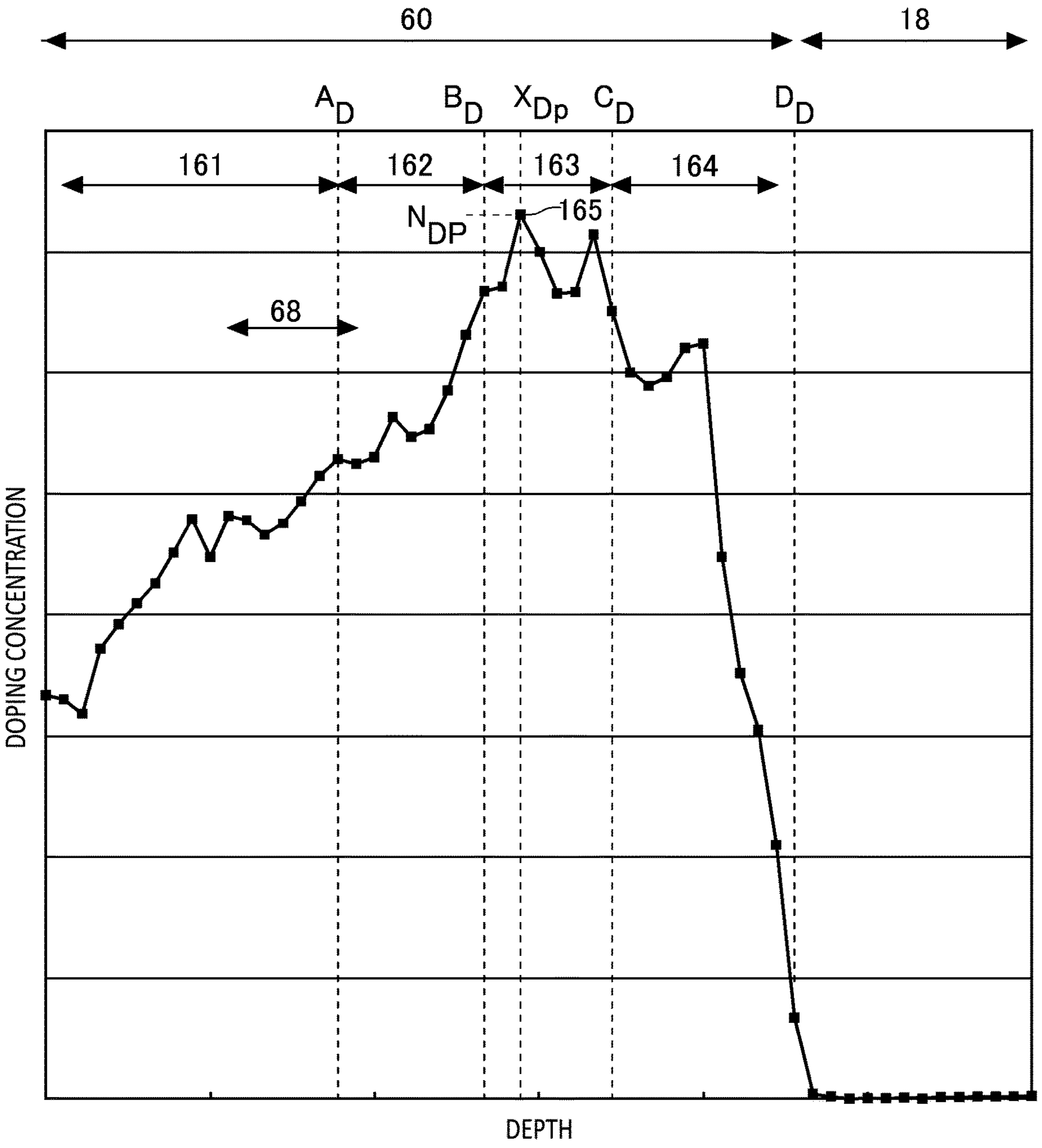
FIG. 8 shows a measurement result of a doping concentration on the back surface 23 side of the semiconductor substrate 10.

FIG. 8 shows a measurement result of a doping concentration on the back surface 23 side of the semiconductor substrate 10. This example shows an example of a distribution of the doping concentration (a net doping concentration, a carrier concentration) measured by the SRP method when a dopant is boron. The dopant is not limited to boron, but may be phosphorous or arsenic. It can be seen that the distribution of the doping concentration measured by the SRP method also reflects a feature similar to that of the analysis result by the SIMS of the back surface side region 60 shown in FIG. 7. That is, the atomic density distribution in the back surface side region 60 may have a shape substantially similar to that of the distribution of the doping concentration in the back surface side region 60. It should be noted that, in the distribution of the doping concentration measured by the SRP method, there may be small increases and decreases in a plurality of measurement values due to a spreading resistance measurement environment such as an error.

As shown in FIG. 8, the semiconductor device 100 may include a doping gradual gradient region 161 for the doping concentration distribution corresponding to the gentle gradient region 61 for the atomic density distribution, a doping steep gradient region 162 for the doping concentration distribution corresponding to the steep gradient region 62 for the atomic density distribution, a doping peak region 163 for the doping concentration distribution corresponding to the peak region 63 for the atomic density distribution, and a doping decrease region 164 for the doping concentration distribution corresponding to the decrease region 64 for the atomic density distribution. That is, the doping concentration distribution in the back surface side region 60 may have the doping gradual gradient region 161, the doping steep gradient region 162, the doping peak region 163, and the doping decrease region 164.

$N_{D_p}$ is a peak doping concentration at a doping peak 165. $X_{D_p}$ is a depth position of the doping peak 165 from the back surface 23 in the depth direction of the semiconductor substrate 10.

The doping decrease region 164 may be a region where the doping concentration decreases from the back surface 23 toward the drift region 18 in the depth direction of the semiconductor substrate 10. The doping decrease region 164 is provided between the doping peak region 163 and the drift region 18. When the semiconductor device 100 includes the buffer region 20, the doping decrease region 164 may be provided between the doping peak region 63 and the buffer region 20, and may be in contact with the buffer region 20.

A lower end of the doping gradual gradient region 161 may be the back surface 23 of the semiconductor substrate 10. An upper end of the doping gradual gradient region 161 may be at a position intermediate between the back surface 23 and the depth position of the doping peak 165 in the doping peak region 163 in the depth direction of the semiconductor substrate 10. That is, the upper end of the doping gradual gradient region 161 may be at a position of 0.5 $X_{D_p}$ with respect to the depth position $X_{D_p}$ of the doping peak 165. It should be noted that the upper end of the doping gradual gradient region 161 may be at a position where the doping concentration is 0.5 $N_{D_p}$ with respect to the doping concentration $N_{D_p}$ at the doping peak 165. Alternatively, a depth range of the doping gradual gradient region 161 may be the same as a depth range of the gentle gradient region 61.

A lower end of the doping steep gradient region 162 may be at the same position as that of the upper end of the doping gradual gradient region 161 in the depth direction of the semiconductor substrate 10. That is, the lower end of the doping steep gradient region 162 may be at a position of 0.5 $X_{D_p}$ with respect to the depth position $X_{D_p}$ of the doping peak 165. An upper end of the doping steep gradient region 162 may be at the same position as that of a lower end of the doping peak region 163 in the depth direction of the semiconductor substrate 10. The upper end of the doping steep gradient region 162 may be at a position where the doping concentration is 0.95 $N_{D_p}$ on the back surface 23 side relative to the doping peak 165, as described below. Alternatively, a depth range of the doping steep gradient region 162 may be the same as a depth range of the steep gradient region 62.

The lower end of the doping peak region 163 may be at a position where a doping concentration is 95% of the doping concentration at the doping peak 165 on the back surface 23 side of the semiconductor substrate 10 relative to the doping peak 165. That is, the lower end of the doping peak region 163 may be at a position where the doping concentration is 0.95 $N_{D_p}$ on the back surface 23 side relative to the doping peak 165. An upper end of the doping peak region 163 may be at a position where a doping concentration is 95% of the doping concentration at the doping peak 165 on the front surface 21 side of the semiconductor substrate 10 relative to the doping peak 165. That is, the upper end of the doping peak region 163 may be at a position where the doping concentration is 0.95 $N_{D_p}$ on the front surface 21 side relative to the doping peak 165. In addition, the upper end and the lower end of the doping peak region 163 may be at positions where doping concentrations are respectively 0.90 $N_{D_p}$. It should be noted that the lower end of the doping peak region 163 may be at a position of 0.9 $X_{D_p}$ with respect to the depth position $X_{D_p}$ of the doping peak 165. The upper end of the doping peak region 163 may be at a position of 1.1 $X_{D_p}$ with respect to the depth position $X_{D_p}$ of the doping peak 165. Alternatively, a depth range of the doping peak 165 may be the same as a depth range of the peak region 63.

A lower end of the doping decrease region 164 may be at the same position as that of the upper end of the doping peak region 163 in the depth direction of the semiconductor substrate 10. That is, the lower end of the doping decrease region 164 may be at a position where the doping concentration is 0.95 Np on the front surface 21 side relative to the doping peak 165. An upper end of the doping decrease region 164 may be at a position where a doping concentration is 10% of the doping concentration at the doping peak 165 on the front surface 21 side of the semiconductor substrate 10 relative to the doping peak 165. That is, the upper end of the doping peak region 163 may be at a position where the doping concentration is 0.1 Np on the front surface 21 side relative to the doping peak 165. Alternatively, a depth range of the doping decrease region 164 may be the same as a depth range of the decrease region 64.

In the back surface side region 60 in this example, the doping gradual gradient region 161, the doping steep gradient region 162, the doping peak region 163, and the doping decrease region 164 may be continuously provided in order from the back surface 23 side. That is, the upper end of the doping gradual gradient region 161 may be in contact with the lower end of the doping steep gradient region 162. The upper end of the doping steep gradient region 162 may be in contact with the lower end of the doping peak region 163. The upper end of the doping peak region 163 may be in contact with the lower end of the doping decrease region 164. In other words, the semiconductor device 100 may have a boundary $A_D$ between the doping gradual gradient region 161 and the doping steep gradient region 162, may have a boundary $B_D$ between the doping steep gradient region 162 and the doping peak region 163, may have a boundary $C_D$ between the doping peak region 163 and the doping decrease region 164, or may have a boundary $D_D$ between the doping decrease region 164 and the drift region 18.

As a result of the upper end of the doping gradual gradient region 161 being in contact with the lower end of the doping steep gradient region 162, a gradient of the doping concentration distribution (a doping concentration gradient) may continuously increase in the doping concentration distribution extending from the doping gradual gradient region 161 to the doping steep gradient region 162. This may be able to make an electrical activation rate of the dopant relatively high. In addition, the doping concentration distribution extending from the doping gradual gradient region 161 to the doping steep gradient region 162 may have a region where the doping concentration partially decreases continuously, or may have a portion where the doping concentration is partially distributed continuously and flatly. Here, the fact that the doping concentration is partially distributed continuously and flatly may mean that, in a range narrower than any or the narrowest region of the gentle gradient region 61, the steep gradient region 62, the doping gradual gradient region 161, or the doping steep gradient region 162, a maximum value and a minimum value of the doping concentration are within 15% of an average value of the doping concentration in the range.

While the present invention has been described by way of the embodiments, the technical scope of the present invention is not limited to the scope described in the above-described embodiments. It is apparent to persons skilled in the art that various alterations or improvements can be made to the above-described embodiments. It is apparent from the description of the claims that embodiments added with such alterations or improvements can also be included in the technical scope of the present invention.

It should be noted that the operations, procedures, steps, stages, and the like of each process performed by an apparatus, system, program, and method shown in the claims, embodiments, or diagrams can be performed in any order as long as the order is not indicated by "prior to," "before," or the like and as long as the output from a previous process is not used in a later process. Even if the operation flow is described using phrases such as "first" or "next" in the claims, embodiments, or diagrams for convenience, it does not necessarily mean that the process must be performed in this order.

EXPLANATION OF REFERENCES

10: semiconductor substrate; 12: emitter region; 14: base region; 15: contact region; 16: accumulation region; 17: well region; 18: drift region; 20: buffer region; 21: front surface; 22: collector region; 23: back surface; 24: collector electrode; 25: connecting part; 30: dummy trench portion; 31: extending portion; 32: dummy dielectric film; 33: connecting portion; 34: dummy conductive portion; 38: interlayer dielectric film; 40: gate trench portion; 41: extending portion; 42: gate dielectric film; 43: connecting portion; 44: gate conductive portion; 50: gate metal layer; 52: emitter electrode; 54: contact hole; 55: contact hole; 56: contact hole; 60: back surface side region; 61: gentle gradient region; 62: steep gradient region; 63: peak region; 64: decrease region; 65: peak; 68: intermediate region; 70: transistor portion; 71: mesa portion; 80: diode portion; 81: mesa portion; 82: cathode region; 85: extension region; 90: boundary portion; 91: mesa portion; 100: semiconductor device; 102: end side; 112: gate pad; 120: active portion; 130: outer circumferential gate runner; 131: active-side gate runner; 140: edge termination structure portion; 151: first lifetime control region; 152: second lifetime control region; 161: doping gradual gradient region; 162: doping steep gradient region; 163: doping peak region; 164: doping decrease region; and 165: doping peak.

What is claimed is:

1. A semiconductor device comprising:

a semiconductor substrate having a front surface and a back surface;

a drift region of a first conductivity type provided in the semiconductor substrate; and a back surface side region in the semiconductor substrate between the back surface of the semiconductor substrate and the drift region in a depth direction of the semiconductor substrate, wherein the back surface side region is of the first conductivity type or a second conductivity type, wherein the back surface side region has a higher atomic density than the drift region, wherein an atomic density distribution in the back surface side region has a gentle gradient region in which an atomic density of a dopant increases towards the drift region, wherein the atomic density distribution in the back surface side region has a steep gradient region from the gentle gradient region towards the drift region, the atomic density of the dopant in the steep gradient region increases towards the drift region, and an atomic density gradient of the dopant in the steep gradient region is steeper than the atomic density gradient of the dopant in the gentle gradient region, wherein the atomic density distribution in the back surface side region has a peak region from the steep gradient region towards the drift region which contains a peak in the atomic density of the dopant, wherein the atomic density distribution in the back surface side region has a decrease region from the peak region towards the drift region and the atomic density of the dopant in the decrease region decreases toward the drift region, and wherein an end of the gentle gradient region is at the back surface of the semiconductor substrate.

2. The semiconductor device according to claim 1, wherein a depth of the peak in the atomic density distribution from the back surface of the semiconductor substrate is 0.8 μm or less.

3. The semiconductor device according to claim 1, wherein an average atomic density in the gentle gradient region is 20% or more and 95% or less of a peak atomic density at the peak in the atomic density distribution.

4. The semiconductor device according to claim 1, comprising an edge termination structure portion which is provided at the front surface of the semiconductor substrate.

5. The semiconductor device according to claim 1, wherein an end of the gentle gradient region closest to the front surface of the semiconductor substrate is at a position intermediate between the back surface and a depth position of the peak in the peak region.

6. The semiconductor device according to claim 1, wherein:

an end of the peak region closest to the back surface of the semiconductor substrate is at a position where the atomic density of the dopant is 95% of the atomic density of the dopant at the peak; and an end of the peak region closest to the front surface of the semiconductor substrate is at a position where the atomic density of the dopant is 95% of the atomic density of the dopant at the peak.

7. The semiconductor device according to claim 1, wherein an end of the decrease region closest to the front surface of the semiconductor substrate is at a position where the atomic density of the dopant is 10% of the atomic density of the dopant at the peak.

8. The semiconductor device according to claim 1, wherein:

an end of the gentle gradient region closest to the front surface of the semiconductor substrate is in contact with an end of the steep gradient region closest to the back surface of the semiconductor substrate;

an end of the steep gradient region closest to the front surface of the semiconductor substrate is in contact with an end of the peak region closest to the back surface of the semiconductor substrate; and an end of the peak region closest to the front surface of the semiconductor substrate is in contact with an end of the decrease region closest to the back surface of the semiconductor substrate.

9. The semiconductor device according to claim 1, comprising a transistor portion, wherein the back surface side region includes a collector region of the second conductivity type.

10. The semiconductor device according to claim 9, wherein the dopant in the collector region is boron.

11. The semiconductor device according to claim 9, wherein in the collector region, the atomic density gradient of the dopant in the gentle gradient region is 1.0E21 (atoms/cm$^4$) or more and 5.0E23 (atoms/cm$^4$) or less.

12. The semiconductor device according to claim 9, wherein in the collector region, the atomic density gradient of the dopant in the steep gradient region is 1.0E22 (atoms/cm$^4$) or more and 1.0E24 (atoms/cm$^4$) or less.

13. The semiconductor device according to claim 9, wherein in the collector region, an atomic density gradient of the dopant in the decrease region is 1.0E23 (atoms/cm$^4$) or more and 1.0E25 (atoms/cm$^4$) or less.

14. The semiconductor device according to claim 9, wherein in the collector region, the atomic density of the dopant at the peak in the peak region is 1.0E+16 (cm$^{-3}$) or more and 1.0E+20 (cm$^{-3}$) or less.

15. The semiconductor device according to claim 9, wherein in the collector region, the atomic density of the dopant at an end of the gentle gradient region closest to the back surface of the semiconductor substrate is 10% or more and 80% or less of the atomic density of the dopant at the peak in the peak region.

16. The semiconductor device according to claim 9, wherein in the collector region, a ratio of the atomic density gradient of the dopant in the gentle gradient region to the atomic density gradient of the dopant in the steep gradient region is 0.01 or more and 0.8 or less.

17. The semiconductor device according to claim 9, wherein in the collector region, a ratio of the atomic density gradient of the dopant in the steep gradient region to the atomic density gradient of the dopant in the decrease region is 0.001 or more and 0.5 or less.

18. The semiconductor device according to claim 1, comprising a diode portion, wherein the back surface side region includes a cathode region of the first conductivity type.

19. The semiconductor device according to claim 18, wherein the dopant in the cathode region is phosphorous.

20. The semiconductor device according to claim 18, wherein in the cathode region, the atomic density gradient of the dopant in the gentle gradient region is 1.0E22 (atoms/cm$^4$) or more and 2.0E24 (atoms/cm$^4$) or less.

21. The semiconductor device according to claim 18, wherein in the cathode region, the atomic density gradient of the dopant in the steep gradient region is 1.0E23 (atoms/cm$^4$) or more and 1.0E25 (atoms/cm$^4$) or less.

22. The semiconductor device according to claim 18, wherein in the cathode region, an atomic density gradient of the dopant in the decrease region is 2.0E24 (atoms/cm$^4$) or more and 2.0E26 (atoms/cm$^4$) or less.

23. The semiconductor device according to claim 18, wherein in the cathode region, the atomic density of the dopant at the peak in the peak region is 1.0E19 (cm$^{-3}$) or more and 1.0E21 (cm$^{-3}$) or less.

24. The semiconductor device according to claim 18, wherein in the cathode region, the atomic density of the dopant at an end of the gentle gradient region closest to the back surface of the semiconductor substrate is 30% or more and 90% or less of the atomic density of the dopant at the peak in the peak region.

25. The semiconductor device according to claim 18, wherein in the cathode region, a ratio of the atomic density gradient of the dopant in the gentle gradient region to the atomic density gradient of the dopant in the steep gradient region is 0.01 or more and 0.5 or less.

26. The semiconductor device according to claim 18, wherein in the cathode region, a ratio of the atomic density gradient of the dopant in the steep gradient region to the atomic density gradient of the dopant in the decrease region is 0.001 or more and 0.3 or less.

27. The semiconductor device according to claim 1, wherein a doping concentration of the dopant at the peak in the peak region is 10% or more and 80% or less of the atomic density of the dopant at the peak in the peak region.

28. The semiconductor device according to claim 1, wherein a doping concentration distribution in the back surface side region has a doping peak region with a doping peak in a depth range as the peak region.

29. A method for manufacturing a semiconductor device, the method comprising:

ion-implanting a dopant into a back surface of a semiconductor substrate, wherein the semiconductor substrate includes a front surface and the back surface; and radiating a laser to the back surface of the semiconductor substrate, wherein in the radiating the laser, a melting depth of the semiconductor substrate melted through radiation of the laser includes a depth position of a peak in an atomic density distribution of the dopant from the ion-implanting the dopant, wherein the radiating the laser includes redistributing the depth position of the peak in the atomic density distribution of the dopant towards the front surface of the semiconductor substrate by melting a radiated region of the semiconductor substrate through the radiation of the laser to form:

a gentle gradient region in which an atomic density of a dopant increases from the back surface towards the drift region;

a steep gradient region from the gentle gradient region towards the drift region, the atomic density of the dopant in the steep gradient region increases towards the drift region, and an atomic density gradient of the dopant in the steep gradient region is steeper than the atomic density gradient of the dopant in the gentle gradient region;

a peak region from the steep gradient region towards the drift region which contains a peak in the atomic density of the dopant; and a decrease region from the peak region towards the drift region and the atomic density of the dopant in the decrease region decreases toward the drift region, and wherein the redistributing the depth position includes precipitating the dopant towards the front surface of the semiconductor substrate by the melting of the radiated region to form the gentle gradient region, the steep gradient region, the peak region and the decrease region.

30. A method for manufacturing a semiconductor device, the method comprising:

forming a drift region of a first conductivity type in a semiconductor substrate, wherein the semiconductor substrate has a front surface and a back surface; and forming a back surface side region in the semiconductor substrate between the back surface of the semiconductor substrate and the drift region, wherein the back surface side region is of the first conductivity type or a second conductivity type, wherein the back surface side region has a higher atomic density than the drift region, wherein the forming the back surface side region comprises ion-implanting a dopant into the back surface of the semiconductor substrate to form an atomic density distribution in the back surface side region, wherein the ion-implanting the dopant comprises forming a gentle gradient region of the atomic density distribution in the back surface side region in which an atomic density of the dopant in the gentle gradient region increases towards the drift region, wherein the ion-implanting the dopant comprises forming a steep gradient region of the atomic density distribution in the back surface side region from the gentle gradient region towards the drift region, the atomic density of the dopant in the steep gradient region increases towards the drift region, and an atomic density gradient of the dopant in the steep gradient region is steeper than the atomic density gradient of the dopant in the gentle gradient region, wherein the ion-implanting the dopant comprises forming a peak region of the atomic density distribution in the back surface side region from the steep gradient region towards the drift region which contains a peak in the atomic density of the dopant, and wherein the ion-implanting the dopant comprises forming a decrease region of the atomic density distribution in the back surface side region from the peak region towards the drift region and the atomic density of the dopant in the decrease region decreases toward the drift region, and wherein an end of the gentle gradient region is at the back surface of the semiconductor substrate.

31. The method for manufacturing a semiconductor device according to claim 30, wherein the forming the back surface side region includes laser annealing the semiconductor substrate from the back surface side of the semiconductor substrate.

32. The method for manufacturing a semiconductor device according to claim 31, wherein in the laser annealing the semiconductor substrate, a melting depth of the semiconductor substrate melted through radiation of a laser is at the peak in the atomic density of the dopant formed from the ion-implanting or is deeper than the peak in the atomic density of the dopant formed from the ion-implanting.

33. The method for manufacturing a semiconductor device according to claim 32, wherein the laser annealing the semiconductor substrate includes redistributing the peak in the atomic density of the dopant, formed from the ion-implanting, towards the front surface of the semiconductor substrate, by melting a radiated region of the semiconductor substrate through the laser annealing.

34. The method for manufacturing a semiconductor device according to claim 33, wherein the redistributing the peak in the atomic density includes precipitating the dopant towards the front surface of the semiconductor substrate by the melting of the radiated region.

35. The method for manufacturing a semiconductor device according to claim 30, wherein the forming the back surface side region does not include furnace annealing for forming the back surface side region.

* * * * *